US008934254B2

(12) United States Patent
Petrick et al.

(10) Patent No.: US 8,934,254 B2
(45) Date of Patent: Jan. 13, 2015

(54) COMPUTER CART

(75) Inventors: Tad Petrick, Evanston, IL (US); Philip Sopicki, Glenview, IN (US); John Poremba, Elmhurst, IL (US); Brian Wixted, Crystal Lake, IL (US); Jim Fisher, Waukegan, IL (US); Harrison Yuan, Buffalo Grove, IL (US); Mike Hansen, Village of Lakewood, IL (US)

(73) Assignee: Bretford Manufacturing, Inc., Franklin Park, IL (US)

( * ) Notice: Subject to any disclaimer, the term of this patent is extended or adjusted under 35 U.S.C. 154(b) by 9 days.

(21) Appl. No.: 13/184,134

(22) Filed: Jul. 15, 2011

(65) Prior Publication Data

US 2011/0266930 A1 Nov. 3, 2011

Related U.S. Application Data

(63) Continuation of application No. PCT/US2010/021267, filed on Jan. 15, 2010.

(60) Provisional application No. 61/145,685, filed on Jan. 19, 2009.

(51) Int. Cl.
*H05K 5/00* (2006.01)
*H05K 7/00* (2006.01)
(Continued)

(52) U.S. Cl.
CPC .............. *G06F 1/266* (2013.01); *G06F 1/1628* (2013.01); *G06F 1/1632* (2013.01);
(Continued)

(58) Field of Classification Search
USPC ........................ 361/679.31–679.4, 679.41–679.49, 361/679.55–679.6, 724–747, 361/679.01–679.09, 679.1–679.19, 361/679.21–679.29, 679.31–679.45; 248/917–924, 80–88, 155.1–155.5, 248/166–173, 180.1–186.2, 229.1–231.51, 248/271.4, 292.14, 316.1–316.8; 292/1–62, 292/113, 169.11–169.23, 341.11–341.19; 312/223.1, 223.2, 331
See application file for complete search history.

(56) References Cited

U.S. PATENT DOCUMENTS 5,903,698 A * 5/1999 Poremba et al. ............... 385/135
6,008,621 A * 12/1999 Madison et al. .............. 320/107
(Continued)

OTHER PUBLICATIONS

International Preliminary Report on Patentability from corresponding PCT application PCT/US2010/021267.

*Primary Examiner* — Jerry Wu
(74) *Attorney, Agent, or Firm* — Anderson Gorecki + Rouille LLP

(57) ABSTRACT

A computer cart has segregated computer storage areas and adapter/cord management areas. This enables the adapters and cords to be stored in an orderly fashion and also prevents the cords and adapters from being accessed or removed from the cart when the computers are being accessed. In one embodiment, extensions of shelves on which the computers are stored extend through a dividing panel into a rear compartment of the cart to create AC adapter shelves for storage of the AC adapters. In another embodiment, the AC adapters are stored in bins in a separate compartment and cords from the AC adapters extend through a dividing panel to an area designed to hold the computers, to enable the computers to be plugged in to be charted while stored in the cart.

14 Claims, 20 Drawing Sheets

(51) Int. Cl.
*A47G 1/10* (2006.01)
*E04G 3/00* (2006.01)
*G06F 1/26* (2006.01)
*G06F 1/16* (2006.01)
*H02J 7/00* (2006.01)

(52) U.S. Cl.
CPC .................. *G06F 1/26* (2013.01); *H02J 7/0013* (2013.01); *H02J 7/0044* (2013.01)
USPC ........... 361/727; 361/725; 361/726; 361/728; 361/729; 361/731; 361/732; 361/733; 361/724; 248/316.5; 248/292.14; 248/229.22; 292/341.17; 292/8; 292/4

(56) References Cited

U.S. PATENT DOCUMENTS

| | | | |
|---|---|---|---|
| 7,325,891 | B1 | 2/2008 | Kinsley et al. |
| 2003/0141687 | A1 | 7/2003 | Wixted et al. |
| 2009/0016008 | A1* | 1/2009 | Hock ........................... 361/683 |
| 2009/0059523 | A1* | 3/2009 | Mallia et al. .................. 361/695 |
| 2009/0109615 | A1* | 4/2009 | Potter et al. ............... 361/679.55 |

* cited by examiner

US 8,934,254 B2

COMPUTER CART

CROSS-REFERENCE TO RELATED APPLICATIONS

This application is a continuation of international application PCT/US2010/021267, filed Jan. 15, 2010, which claims priority to U.S. Provisional Patent Application No. 61/145,685, filed Jan. 19, 2009, entitled COMPUTER CART, the content of each of which is hereby incorporated herein by reference.

BACKGROUND OF THE INVENTION

1. Field of the Invention

The present invention relates to computer storage systems and, more particularly, to a computer cart.

2. Description of the Related Art

Computers, such as laptop computers and tablet computers, are commonly used in educational facilities. When not in use, the computers are generally required to be stored in a secure manner to prevent them from being stolen or tampered with. Accordingly, it is common to store the computers in a lockable cart that will deter the students and other people from accessing the computers without permission. Often the cart is provided with wheels so that it may be moved to different places so that the computers may be used in different classrooms.

Conventional laptop computers include a battery that may be charged to enable the laptop to be used while not connected to an electrical outlet. When the laptop is to be charged, an electrical adapter is used to convert 120/240 volt 60/50 Hz AC electrical power available in a standard electrical outlet to a lower voltage DC form. For example, the electrical adapter may convert available line power to 19.5 volt or 24 volt DC power which is then input to the computer to charge the battery.

Electrical adapters may come in different sizes, but often the adapter will be on the order of 6 inches long, 2-3 inches wide, and 1-2 inches thick. Colloquially, electrical adapters are often referred to as "bricks" although other terms may also be used to refer to these types of electrical adapters.

Each electrical adapter typically includes two cords—one cord that enables the electrical adapter to be plugged into an electrical wall outlet, and another cord that enables the electrical adapter to be connected to the computer. Since the electrical adapter is used when the computer is charging as well as when the computer is plugged in during operation, the cords are frequently relatively long. For example, the cord that plugs into the wall outlet may be 3-4 feet long and the other cord that connects the computer to the adapter may be 5-6 feet long. These lengths are merely examples, as other length cords may be used as well. Depending on the implementation, however, the overall cord length may be on the order of 10 feet.

Many computer carts are designed to enable laptop computers to be charged while stored within the computer cart. Since the AC adapters are used while charging the computers, this implies that the computer carts must accommodate not only the large number of computers, but also must accommodate the large number of AC adapters as well as the attendant cords associated with the computers. For example, in a computer cart designed to hold 24 computers, the computer cart will also include 24 AC adapters and approximately 240 feet of electrical wires designed to enable the adapters to connect the computers to on-board electrical power supply.

SUMMARY OF THE INVENTION

The following Summary and the Abstract set forth at the end of this application are provided herein to introduce some concepts discussed in the Detailed Description below. The Summary and Abstract sections are not comprehensive and are not intended to delineate the scope of protectable subject matter which is set forth by the claims presented below.

A computer cart has segregated computer storage areas and adapter/cord management areas. This enables the adapters and cords to be stored in an orderly fashion and also prevents the cords and adapters from being accessed or removed from the cart when the computers are being accessed. In one embodiment, extensions of shelves on which the computers are stored extend through a dividing panel into a rear compartment of the cart to create AC adapter shelves for storage of the AC adapters. In another embodiment, the AC adapters are stored in bins in a separate compartment and cords from the AC adapters extend through a dividing panel to an area designed to hold the computers, to enable the computers to be plugged in to be charted while stored in the cart.

BRIEF DESCRIPTION OF THE DRAWINGS

Aspects of the present invention are illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure. In the figures.

DETAILED DESCRIPTION

FIGS. 1-17 illustrate two embodiments of a computer cart 10 for designed to maintain a large number of portable computers such as laptop or tablet computers. The computer cart 10, as described in greater detail below, has segregated computer storage areas and adapter/cord management areas. This enables the adapters and cords to be stored in an orderly fashion and also prevents the cords and adapters from being accessed or removed when the computers are being removed from the cart or replaced into the cart.

Figure 1:
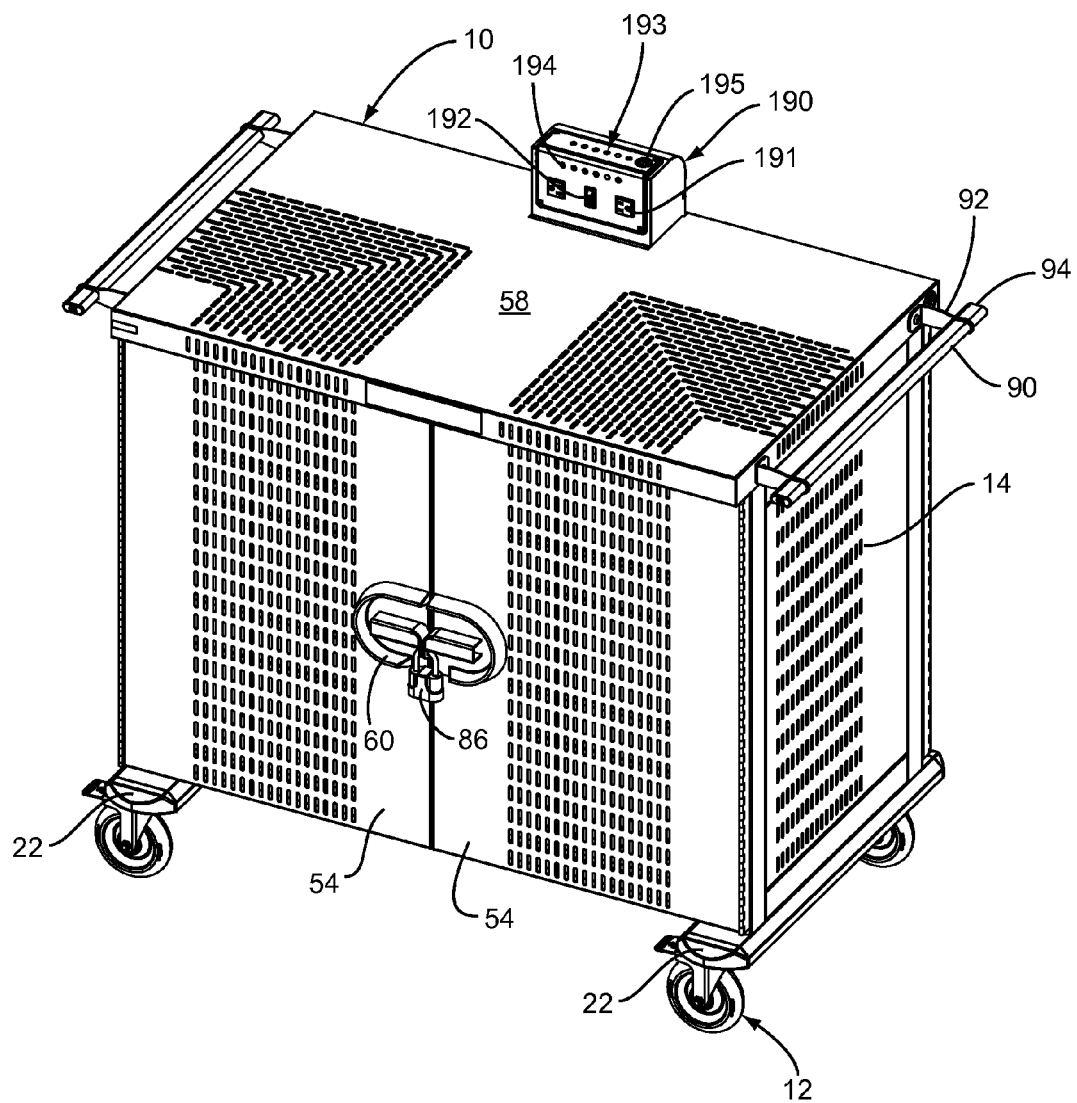
FIG. 1 is a front perspective view of a computer cart according to an embodiment of the invention.
Figure 2:
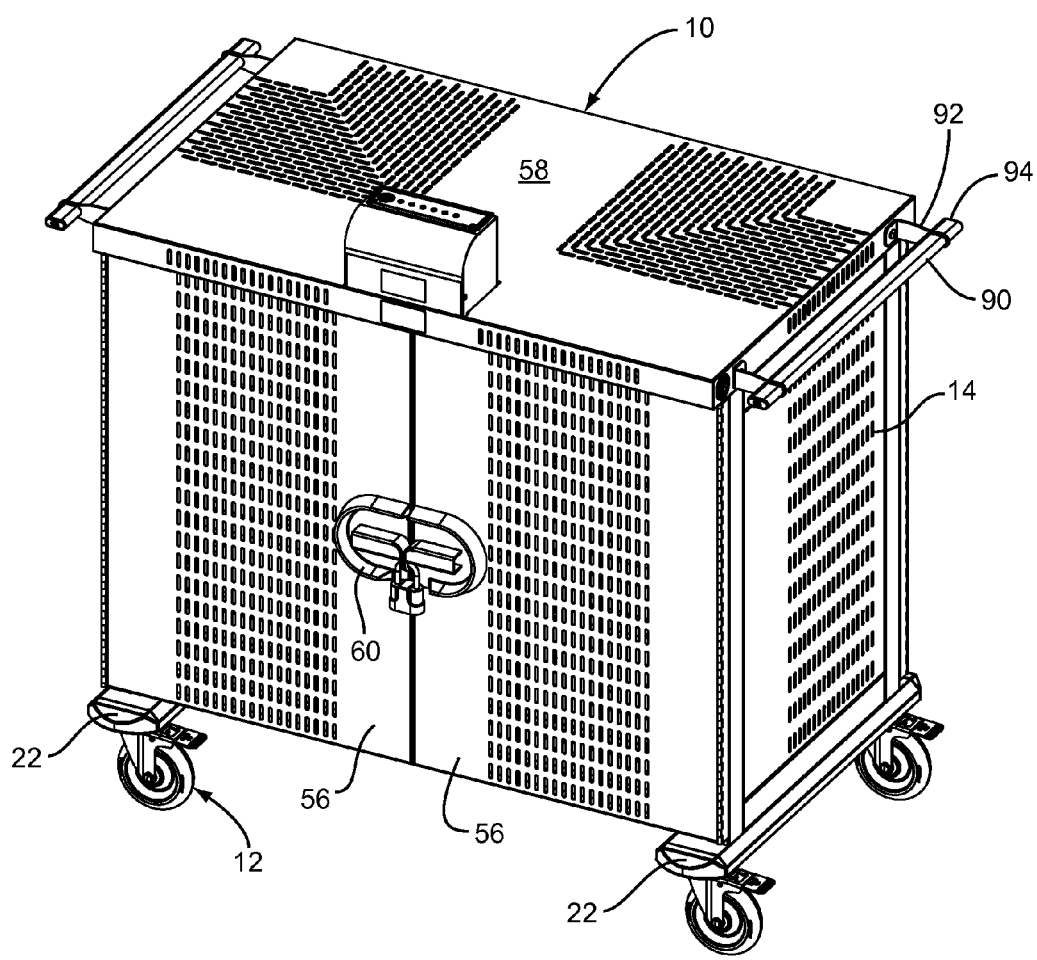
FIG. 2 is a rear perspective view of the computer cart of FIG. 1.
Figure 16:
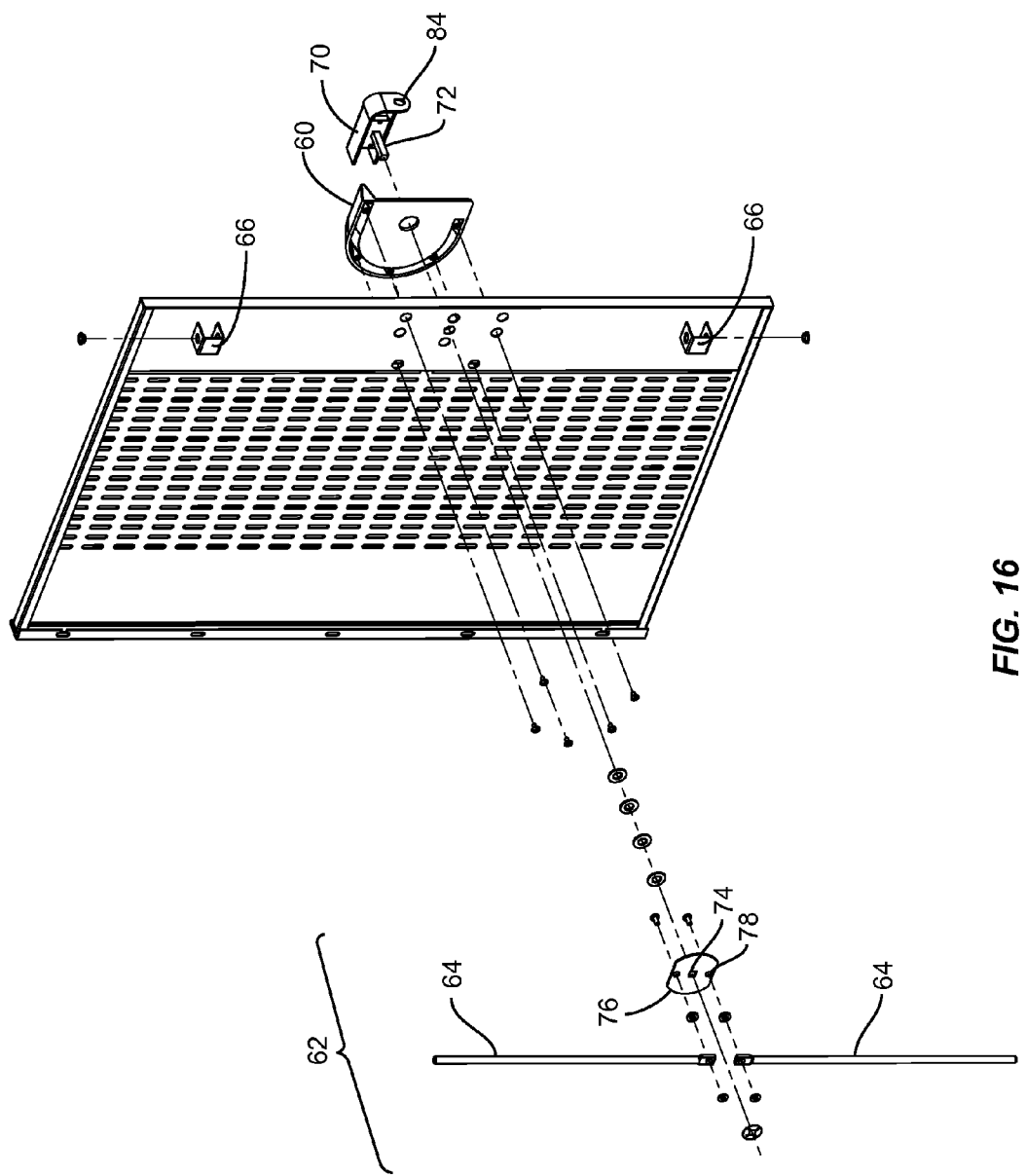
FIGS. 16-17 are perspective views of door assemblies that may be used on the computer cart of FIG. 1.
Figure 17:
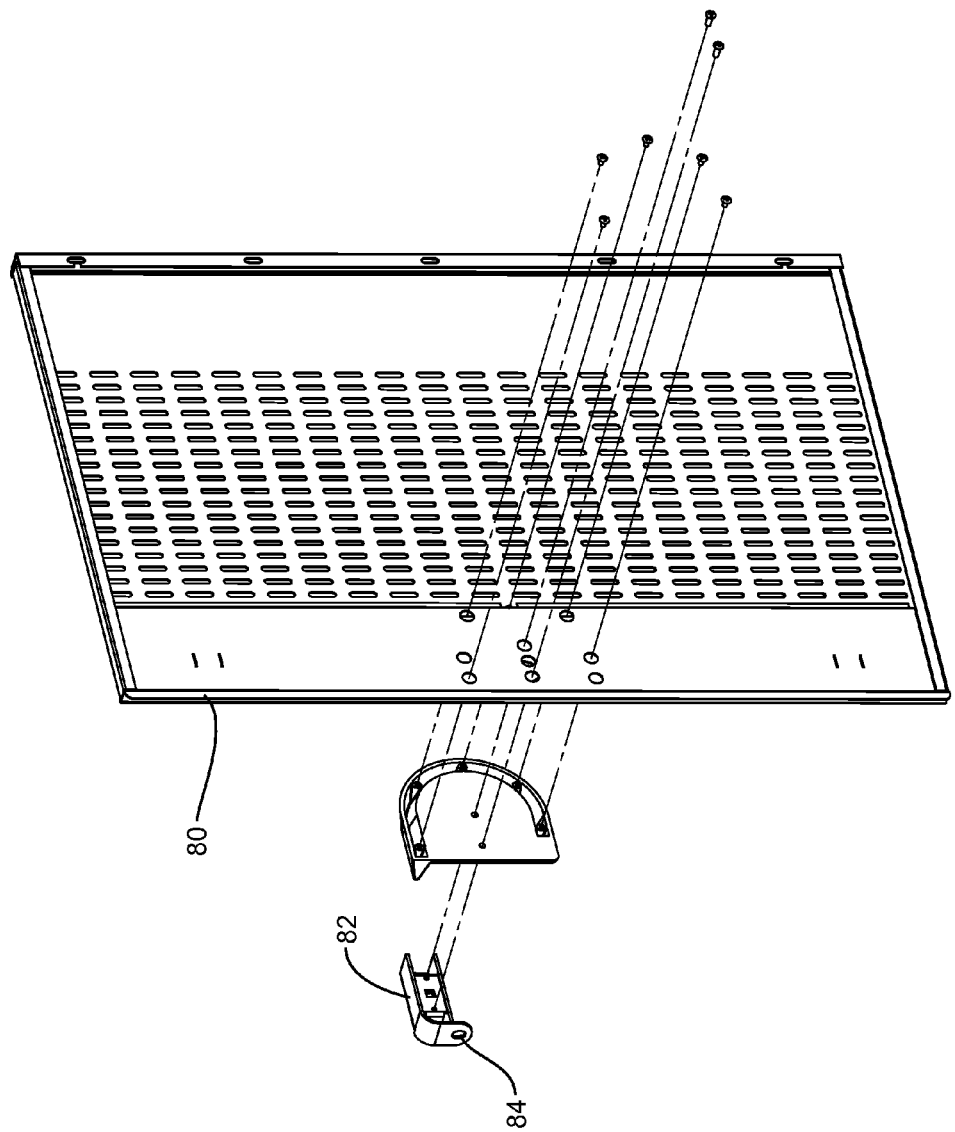

FIGS. 1-17 show two separate embodiments of the invention. Specifically, FIGS. 3-8 show an embodiment that is designed to store laptop computers horizontally, whereas FIGS. 9-17 show an embodiment that is designed to store laptops vertically. The exterior appearance of the two embodiments is similar, however, and FIGS. 1-2 show the overall exterior appearance of both embodiments of the laptop cart. Likewise, FIGS. 16-17 show an example door structure and FIGS. 18-21 show example electrical systems that may be used with either embodiment of the computer cart. Since the two embodiments store computers in different orientations, the interior space of the two embodiments has been adjusted to accommodate different storage requirements.

As shown in FIG. 1, the computer cart 10 is generally is formed as a cabinet mounted on wheels 12 that are configured to enable the cart to be mobile. The wheels may be castors or other types of wheels. The computer cart 10 is designed to store laptop computers and to charge the laptop computers while stored therein. Charging laptop computers generates heat, which is required to be dissipated from the cart so as to not overheat the computers. Accordingly, ventilation holes 14 are included in the outer surfaces of the computer cart to enable air to circulate into and out of computer cart 10. The ventilation holes may be located as shown or may be formed in another decorative pattern if desired. The particular number of ventilation holes will depend on the number of laptops the cart is designed to contain as well as the anticipated heat output of the laptops. The ventilation apertures may be shaped as rectangles with rounded ends as shown or may be formed using other shapes. The ventilation apertures enable air to circulate between the interior and exterior the computer cart to enable heat generated by the computers within the computer cart to be dissipated.

Figure 3:
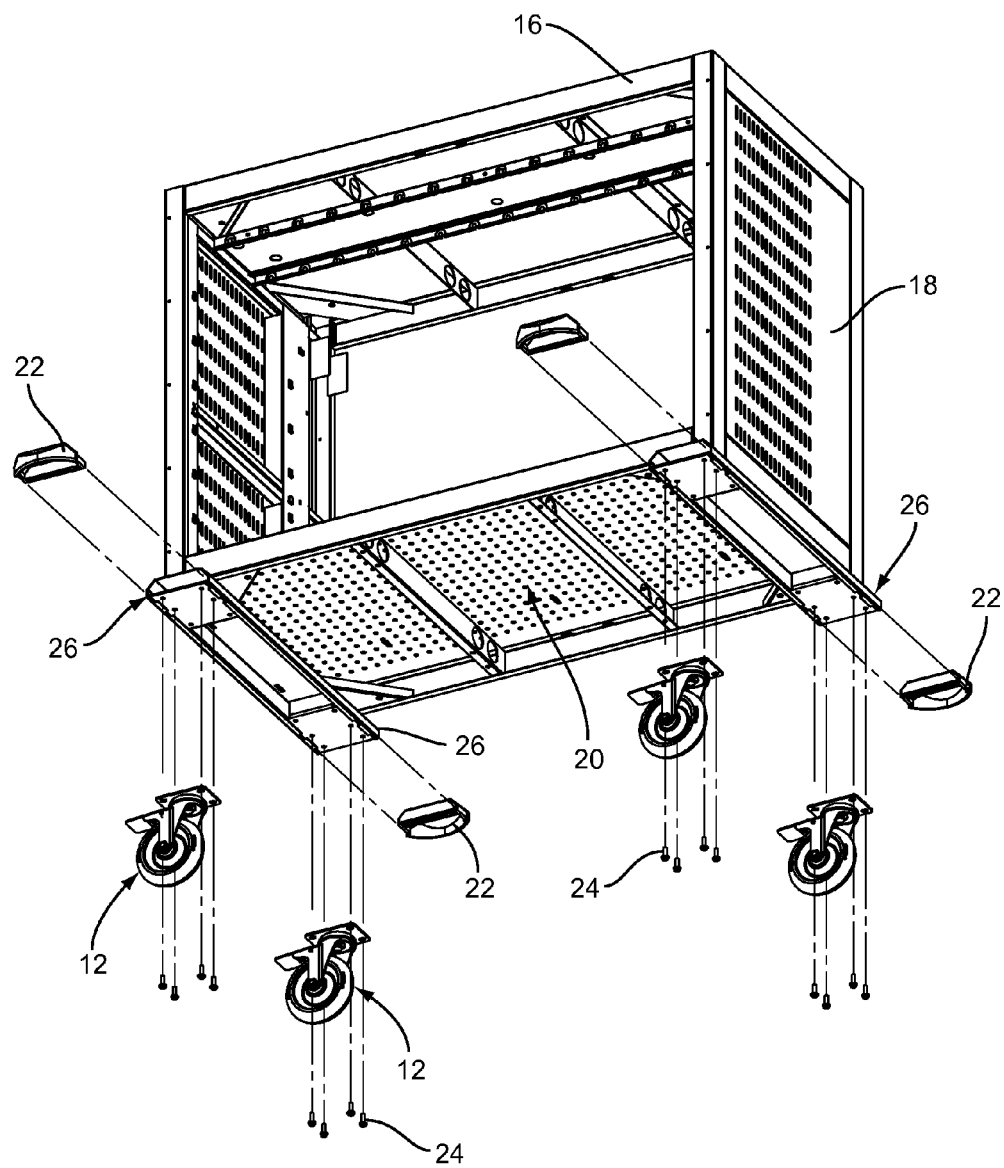
FIG. 3-7 are perspective views of an embodiment of the computer cart of FIG. 1 showing successive stages of construction of the computer cart.

FIG. 3 is a lower perspective view of the computer cart showing the interior structure of the frame of the computer cart and showing how the wheels 12 are attached to the laptop cart. As shown in FIG. 3, the computer cart 10 generally includes frame 16 designed to give structural rigidity to the computer cart and to generally define the overall shape of the cart. Side panels 18 are attached to the frame, for example by welding, rivets, or using removable fasteners. The side panels in the illustrated embodiment are not movable relative to the frame once installed and are designed to enclose the computer cart without enabling users to access the computers through the sides of the computer cart. The computer cart also includes bottom panel 20 which, like side panels 18, may be attached to the frame by welding, rivets, or using removable fasteners. The panels are preferably formed from steel or other suitably solid material to deter thieves from attempting to cut through the material forming panels 18, 20, to access computers stored within the computer cart 10.

FIG. 3 also shows how wheels 12 and bumpers 22 are installed on computer cart 10. As shown in FIG. 3, wheels 12, which may be implemented using castors, are connected to the cart 10 using screws 24. Alternatively other mechanical fasteners may be used. The screws 24 affix wheels 12 to extension plates 26 mounted to the frame 16 or forming part of frame 16. The extension plates 26 extend a short distance out from the frame 11 on each of the corners of the computer cart. Protective bumpers 22 are attached to the ends of the extension plates 26 to soften the ends of the extension plates 26 and provide a cushion for the computer cart at a location where the cart is most likely to come into contact with external objects.

Where the wheels are implemented using castors, the castors may be directional locking castors as well as motion locking castors. Castors of this nature typically have two levers—one that locks the direction of the castor and the other that locks the wheel from moving. To move the computer cart under normal conditions, two of the castors may be locked to be directionally aligned with the computer cart while the other two castors swivel. However, for maneuvering the cart in tight quarters, the other two castors may be directionally unlocked so that all four castors can swivel. Once the cart is positioned, the other lever may be used to lock the wheels to prevent the wheels from moving and, hence, prevent the cart from rolling so that the cart will remain in a fixed position. Other types of castors may be utilized as well.

Figure 4:
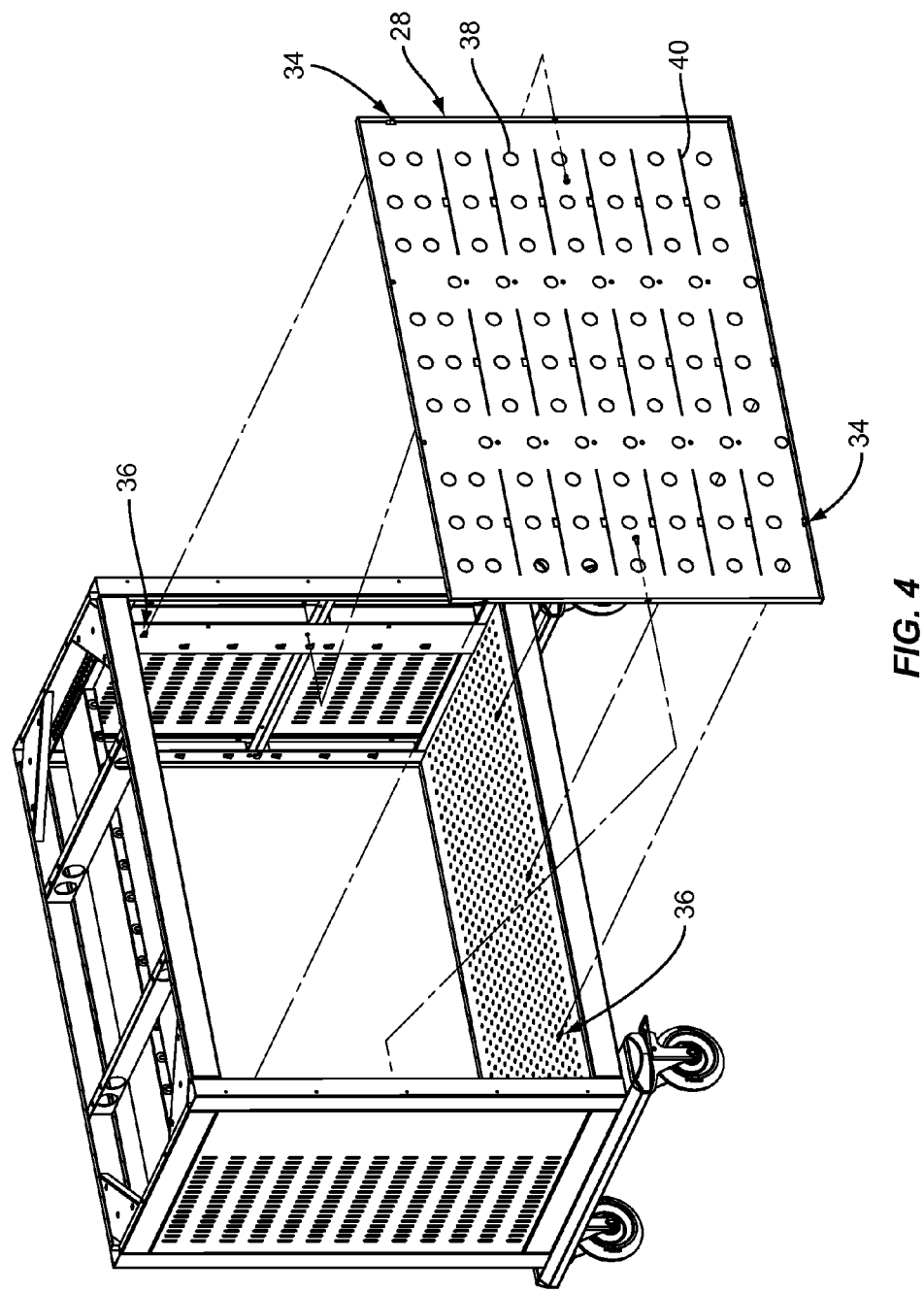

As shown in FIG. 4, the computer cart 10 includes a dividing panel which is inserted into the computer cart between side panels 18 and which divides the computer cart into a front compartment 30 and rear compartment 32. The dividing panel 18 extends generally parallel to the front of the cart, and also generally parallel to the rear of the cart, so that the front and rear compartments have approximately constant depth across the width of the cart. As is visible from FIG. 5, the dividing panel is located within the interior of the cart toward the back of the cart so that the rear compartment 32 of the cart 10 is shallower (does not extend as far into the cart) than the front compartment 30. In operation, as described below, the front compartment of the cart will be used to store the laptop computers while the rear compartment of the cart will be used to store the AC adapters and power cords.

The dividing panel 28 may be provided with slots 34 (see FIG. 4)*that* mate with tabs 36 within cart 10 to enable the dividing panel to be secured within the computer cart. Screws or other mechanical fasteners may be used to fasten the dividing panel within the computer cart. Alternatively, the dividing panel may be welded or other mechanical fasteners may be used to secure the dividing panel within the cart.

As shown in FIG. 4, apertures 38 are included within dividing panel 28 both for ventilation and to enable power cords from the AC adapters to be fed through the dividing panel from the rear of the cart to the front of the cart. Optionally a rubber gasket may be used to hold the wire in place within the aperture to prevent it from being pulled forward into the front compartment of the cart. Alternatively, a thin gasket, grommet, or washer may be inserted on the edges of the aperture to prevent the wire from rubbing against any potentially sharp edges of the aperture that may have been formed during manufacturing.

Figure 5:
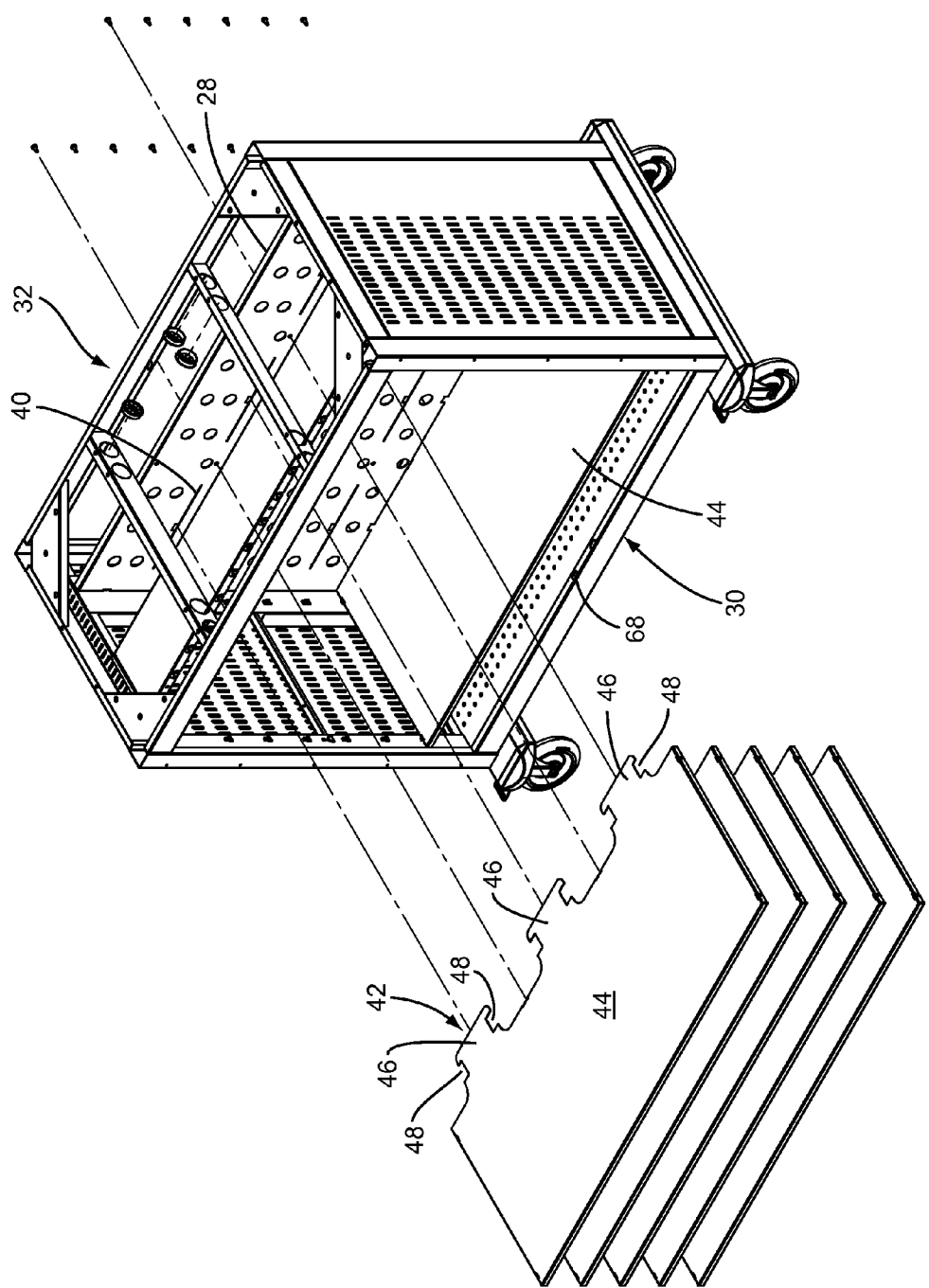
Figure 6:
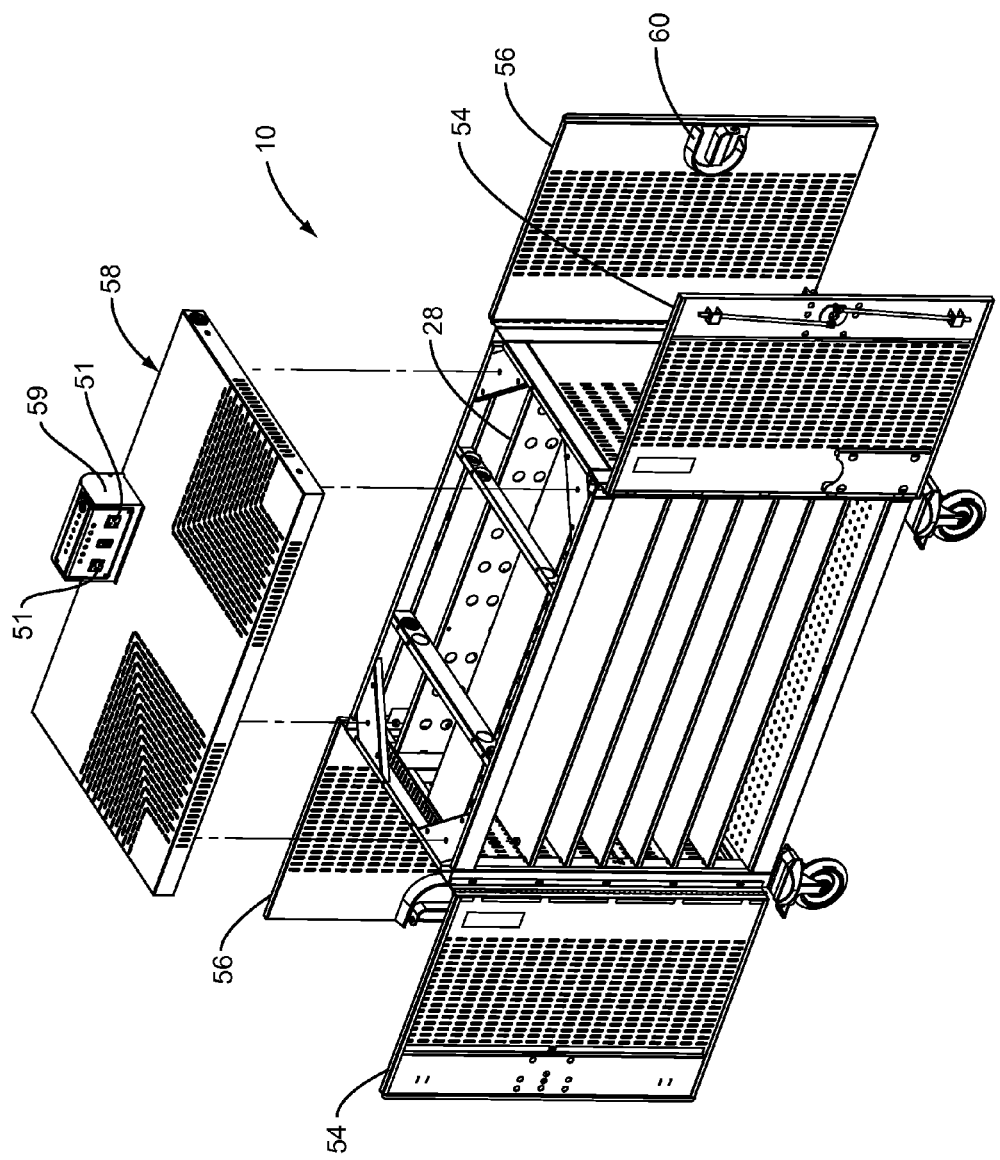
Figure 7:
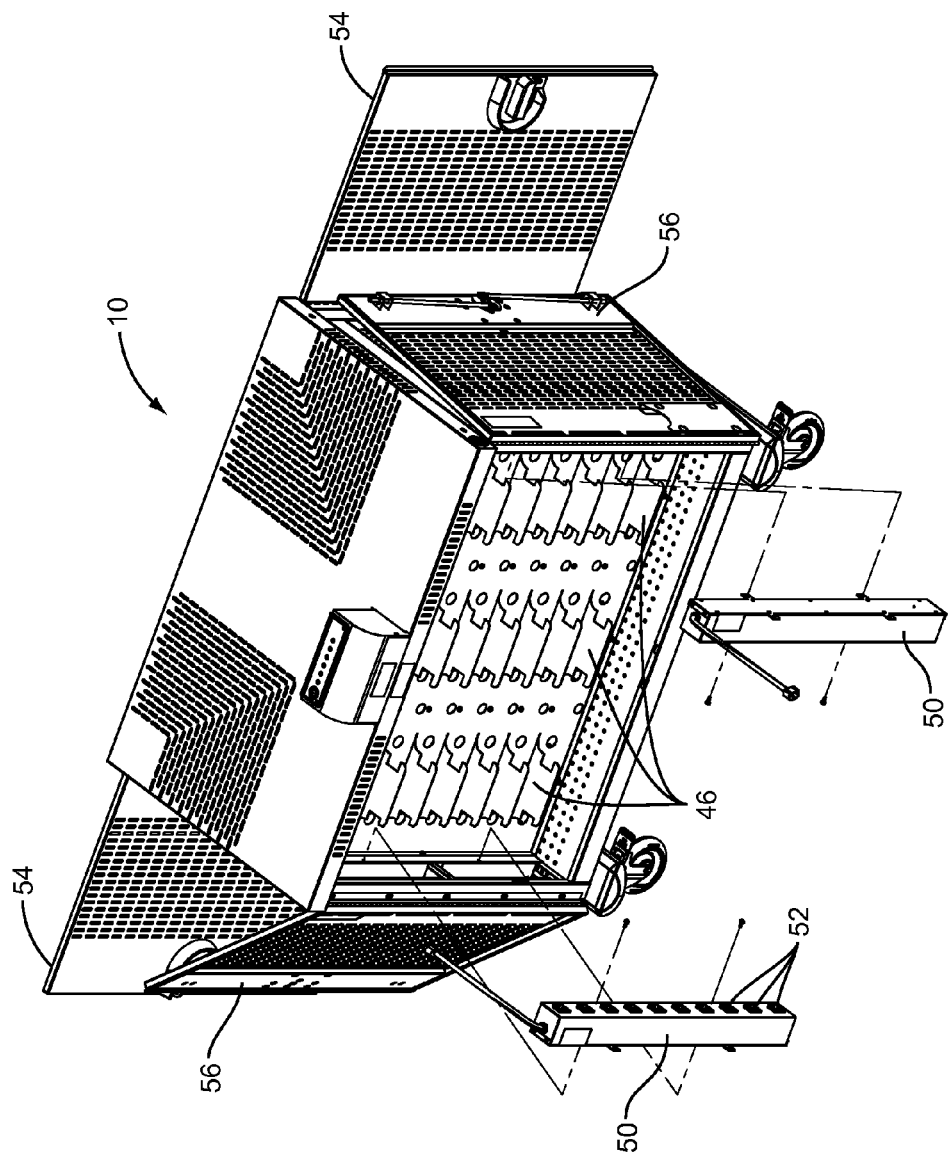
Figure 8:
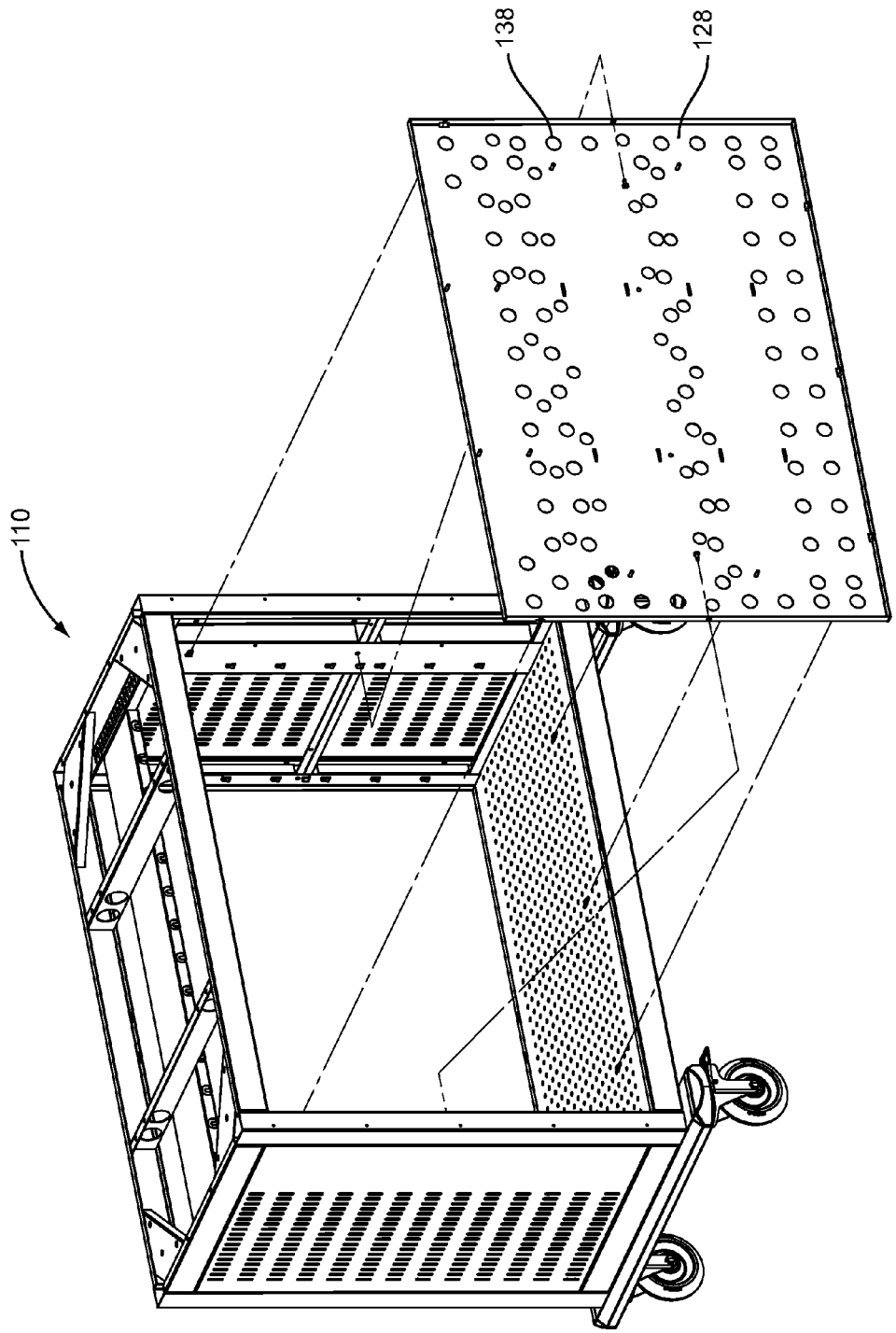
FIGS. 8-15 are perspective views of another embodiment of the computer cart of FIG. 1 showing successive stages of construction of the computer cart.
Figure 9:
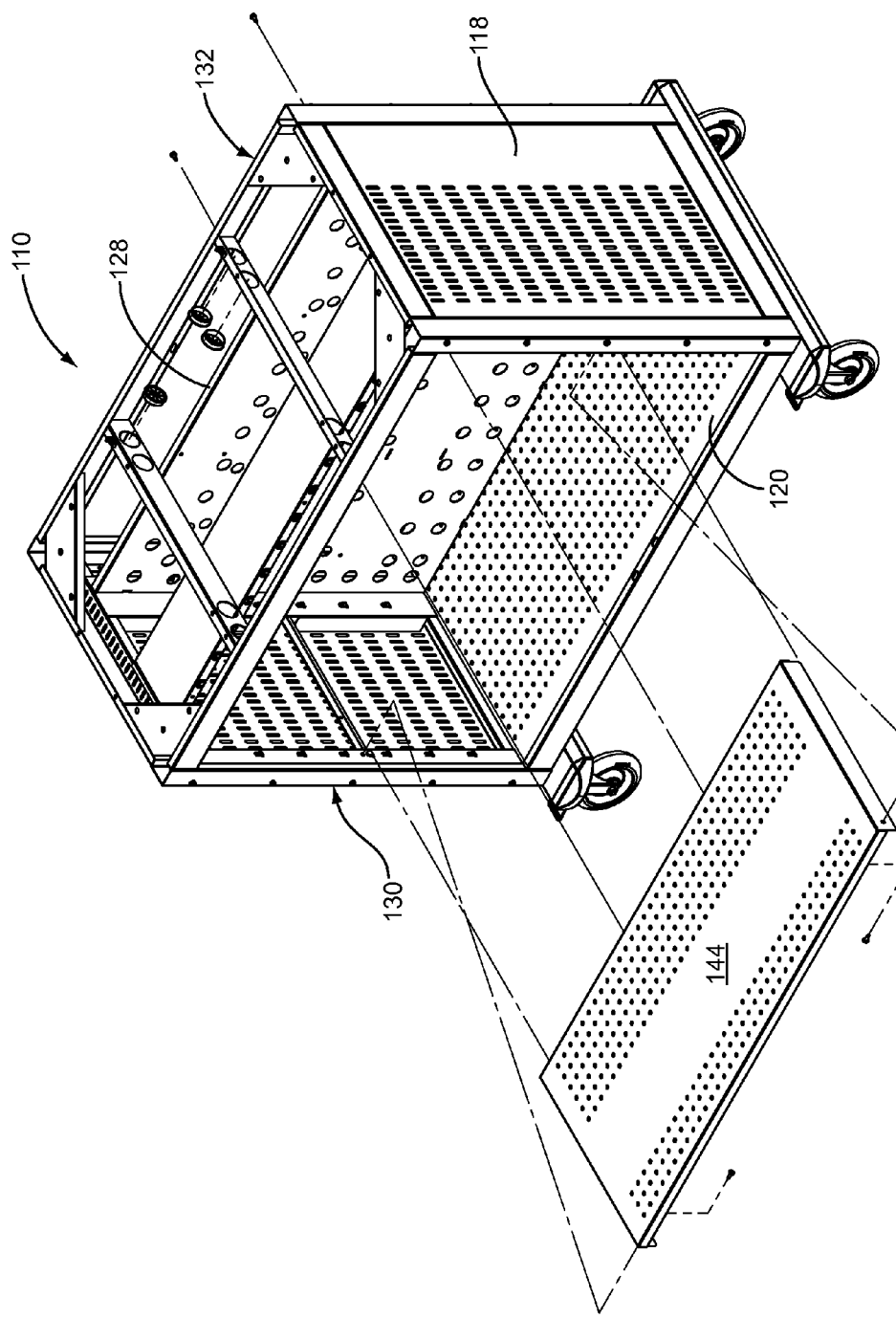
Figure 10:
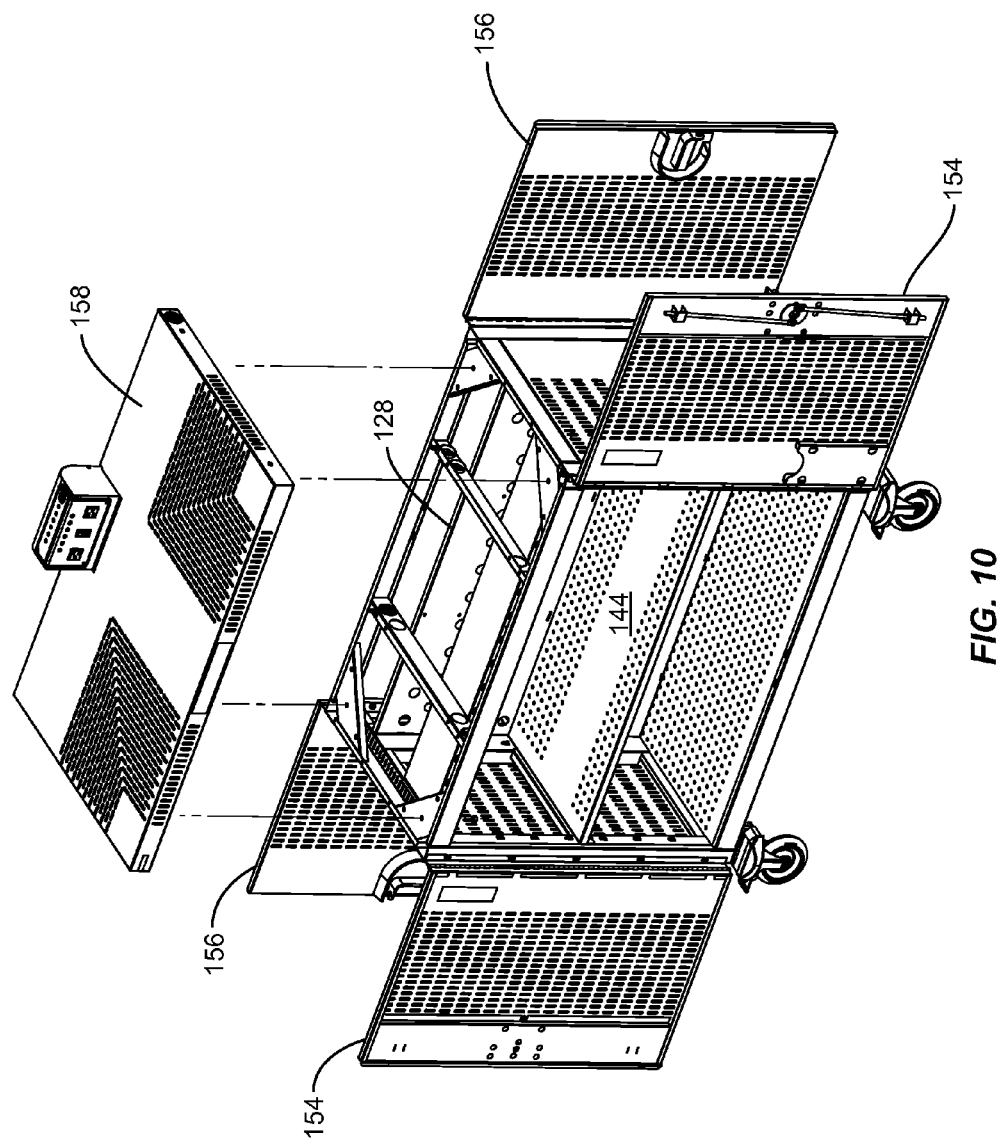
Figure 11:
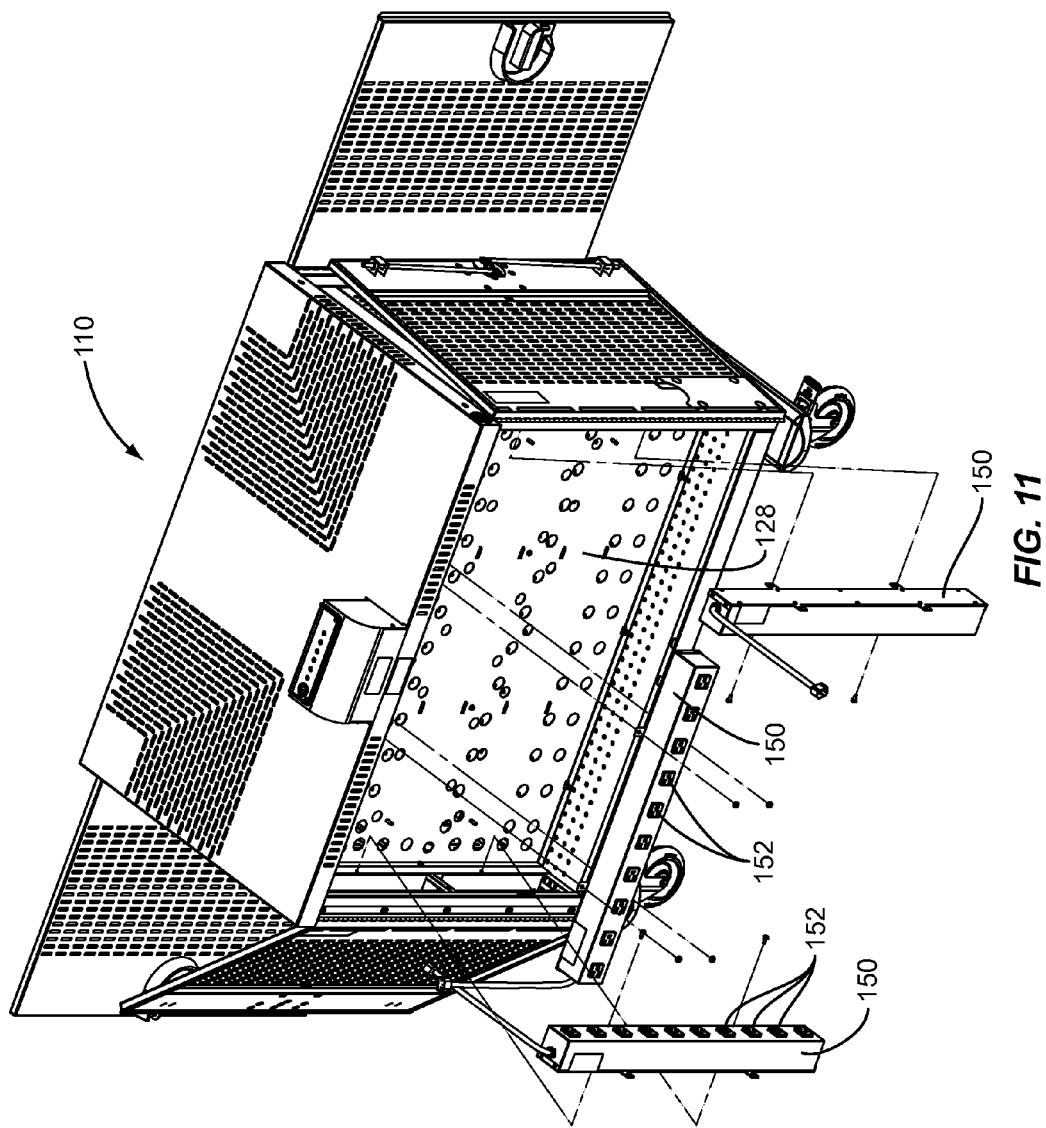

In the embodiment shown in FIGS. 4-5, the dividing panel 28 includes a plurality of elongated horizontal slots 40 designed to receive extensions 42 of shelves 44. The extensions 42 of shelves 40 fit through the horizontal slots 40 in dividing panel 28 to create small shelves 46 within the rear compartment of the cart 10. The small shelves 46 are best shown in FIG. 7. The shelves 44 may be connected to the side panels 18 and the divider panel 28 using screws or other mechanical fasteners.

Each of the small shelves 46 is sized to hold a standard sized AC adapter and includes integrated cord management indentations 48. Since current AC adapters are approximately 6 inches long, the shelves may be on the order of 6 inches long as well. Other dimensions may be utilized as well depending on the particular implementation. Power strips 50 are included along the edges of the rear compartment of the cart (see FIG. 7) to provide power receptacles in the vicinity of the small shelves 46.

In operation, an AC adapter for each of the computers to be stored in the computer cart will be placed on its own small shelf 46. The AC adapters will be plugged into outlets 52 contained in the power strip 50 and any excess power cord not required to span the distance from the shelf where the AC adapter is stored and the selected outlet 52 will be wrapped around the AC adapter and shelf 46. The cord management indentations 48 in the small shelf will help hold the cords in place while wrapped around the AC adapter and shelf to provide integrated cord management for each computer stored in the computer cart.

The low voltage cords that are used to connect the AC adapters to the computers will be fed through selected apertures in the divider panel to enter the front compartment above a shelf where the associated computer is to be stored. A washer or other soft structure may be provided within the aperture to protect the cords from any sharp edges associated with the aperture. Alternatively, the apertures may be splayed to provide a smooth surface at the point of contact between the cord and the divider panel. A sufficient length of cord should be fed into the interior compartment to enable a user to conveniently plug the end of the cord into a laptop computer to be inserted into the cart. The low voltage cord will thus extend over the top of shelf 44 to enable the cord to be inserted into a power receptacle on the computer so that the computer may be charged while being stored on the shelf. Any excess low power cord not required to be available within the front compartment may be wrapped around the AC adapter and small shelf and held in place within the rear compartment of the cart via cord management indentations.

In FIGS. 5-8, the shelves have been shown as not including ventilation apertures which helps to prevent heat from being vertically transmitted from the lower laptops to the upper laptops. If desired additional apertures may be included within these shelves to further facilitate passive ventilation. The shelves do not extend all the way to the side panels, however, so that a chimney of air may flow within the cart along the side panels. Active ventilation, e.g. one or more fans, may also be included if necessary to achieve adequate heat dissipation from the front and/or rear compartments of the cart.

The number of shelves and width of the shelves contained within the computer cart determines the carrying capacity of the computer cart. In the illustrated example, the computer cart includes six shelves, each of which can hold up to three laptops. In another embodiment, the width of the shelves may be adjusted to accommodate fewer or additional computers. In the illustrated embodiment, the computer cart is designed to carry and charge 20 laptops total (3 on each shelf and 2 on the bottom panel 20). These 20 laptops plug into 20 outlets 52 on power strips 50 (10 outlets per power strip) to enable all of the laptops to charge without plugging/unplugging sets of laptops. Other non-charging equipment may be stored in the laptop cart as well if desired. Addition of extra shelves or lengthening of the shelves may enable the laptop cart to hold larger numbers of laptops. In this instance, the number of power strips 50 or the number of outlets per power strip may be increased to accommodate the larger number of laptops.

The shelves are spaced vertically to enable the computers to be stored in the computer cart while partially open—i.e. without requiring the LCD display to be shut into the base of the computer. This enables the computers to remain active/alive while stored in the computer cart so that the computers may be updated/synchronized while stored in the cart.

The computer cart 10 has a pair of front doors 54 on the front and a second pair of rear doors 56 on the back. Preferably, the doors are recessed into the frame of the cart to make it more difficult to pry the doors open when locked. The front doors 54 provide access to the front compartment of the cart 30 and the rear doors 56 provide independent access to the rear compartment of the cart 32. By having separate access to the rear compartment of the cart, the AC adapters and wire management may be independently secured, so that students or other individuals authorized to use the computers cannot access the AC adapters and excess wiring. This makes the computer cart appear neater from the front and also provides a security measure to ensure that the AC adapters or one or more wires does not accidentally go missing. In one embodiment, both sets of doors may be folded to be flat along the sides of the computer cart.

The front doors 54 and rear doors 56 are each provided with a handle 60. Additional details about the handle are shown in FIGS. 16 and 17. As shown in FIG. 16, one side of the door includes a locking mechanism 62 including two rods 64 that are designed to extend through brackets 66 and engage into apertures 68 in a frame 16 of the computer cart. When the rods enter the apertures 68, the rods secure the door to the frame so that the doors are not able to be opened except upon application of excessive force.

The handle 60 includes a lever 70 having a square shaft 72. The square shaft 72 mates with a square aperture 74 in plate 76. The plate 76 has two radially opposite apertures 78 that enable the rods 64 to be rotatably attached to the plate 76. A rivet or other mechanical fastener may be used to attach the rods to the plate 76. In operation, a person moves the lever 70 which causes the square shaft 72 to rotate. This causes the plate 74 to rotate, so that the holes are either vertically aligned (in which case the rods are pushed up/down into apertures 68) or the holes are horizontally aligned (in which case the rods are pulled out of the apertures 68). In this manner the lever enables the doors to be locked.

In the embodiment shown in FIGS. 16-17, one door has a locking mechanism and the other door does not have a locking mechanism (FIG. 17). The door without the locking mechanism may have a lip 80 formed on the inside edge (where it will abut the other door) so that the door with the locking mechanism can hold the other door closed. Optionally, a matching, albeit fixed, lever 82 may be provided on the door without a locking mechanism. If desired, a pair of apertures 84 may be provided in movable lever 70 and fixed lever 82 to enable the doors to be secured with a padlock 86 (see FIG. 1).

The cart is equipped with a handle 90 (see FIG. 1) on either side that will enable the cart to be grasped to be moved by an operator. As shown in FIG. 1, the handle 90 may be formed from a flattened tubular bar that is connected to the cart by brackets 92. Optionally, end caps 94 may be provided to enclose the interior of the tubular bar. Other handle shapes may be used as well.

Preferably the brackets 92 may be disposed inward from the end of the handle a short distance, i.e. an inch or two, to enable the handle to be used for power cord management. Specifically, the computer cart is equipped with a power cord that will enable the computer cart to be plugged into an ordinary wall outlet. The power cord may be stored within the rear compartment or, alternatively, passed through an aperture in the computer cart to be accessible outside of the rear compartment. When the cord is not plugged into the wall outlet, the cord may be wrapped about the brackets 92 holding the handle to the cart so that the cord can be wound for storage during transit without requiring the cord to be tucked away into the rear compartment. Alternatively, a separate set of power cord management brackets may be attached to the side of the computer cart or to one of the rear doors of the computer cart to enable the cord for the computer cart to be secured when not in use.

FIGS. 8-15 show another embodiment in which the laptop cart 110 is designed to store laptops vertically. This embodiment is similar to the previous embodiment (FIGS. 3-7) in that the cart is formed as a cabinet having a dividing panel 128 separating the interior of the cart into two compartments—a front compartment 130 and a rear compartment 132. As in the previous embodiment, the dividing panel has a plurality of apertures 138 for ventilation and to enable low voltage power cables from the AC adapters to be passed from the front compartment where the laptops are stored to the rear compartment where the AC adapters are stored.

Figure 12:
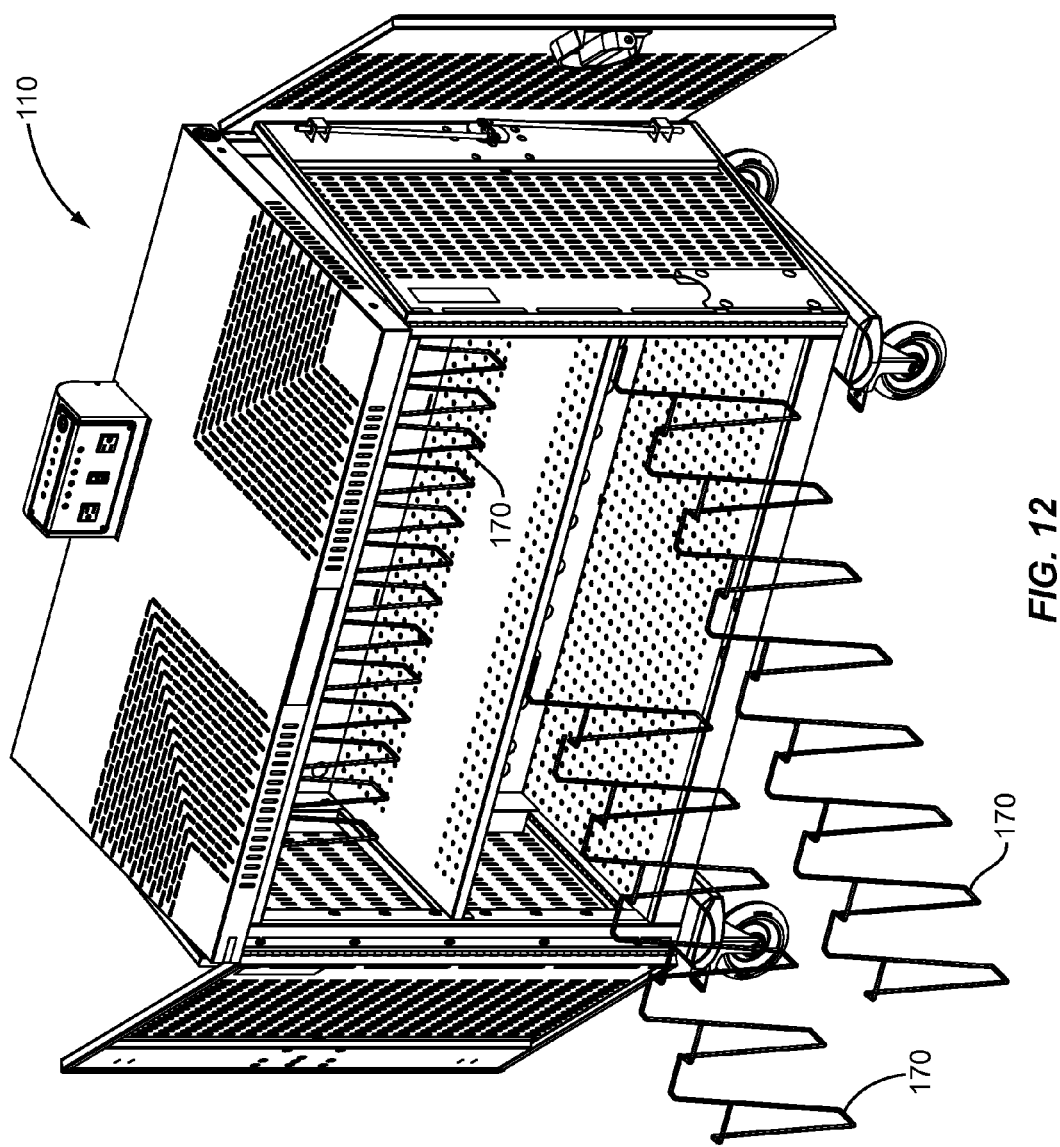
Figure 13:
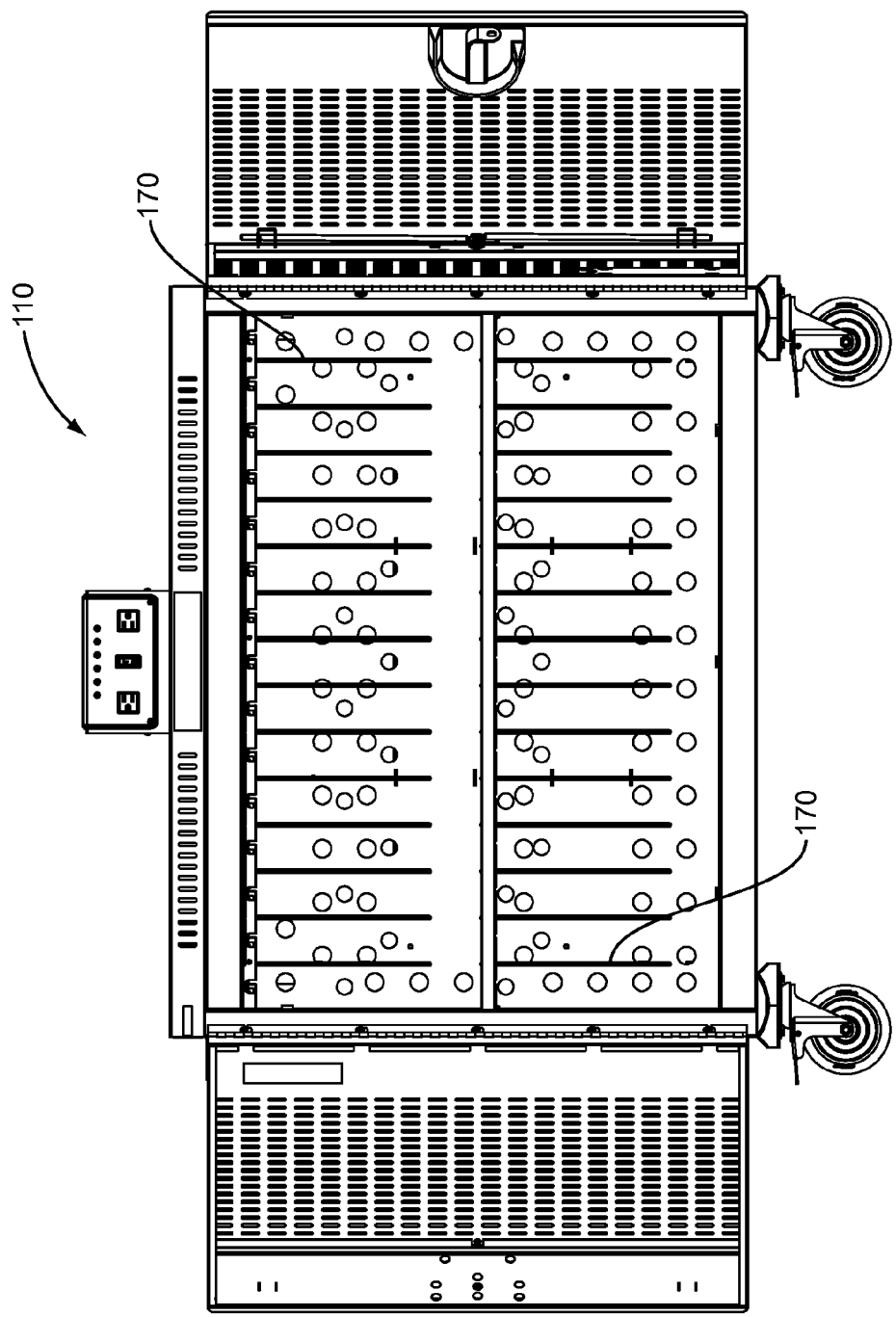

As shown in FIGS. 12-13, since the laptops are stored vertically on edge within the cart, the vertical spacing between the shelves is increased to enable the laptops to be stored while standing on edge. Thus, in the illustrated embodiment, only one shelf 144 is included within the front compartment of the cabinet, which may be anchored to the frame of the cabinet using tabs/slots and appropriate mechanical fasteners. The shelf 144 is also attached to the dividing panel to provide support along the length of the shelf. If larger numbers of laptops are to be stored within the computer cart, the shelf may be extended or the height of the cart may be increased to accommodate extra shelves.

Unlike the previous embodiment, the shelf does not extend through the divider panel. Rather, the shelf terminates at the divider panel (although tabs from the shelf may extend through slots in the divider panel to help secure the shelf along the divider panel. A wire bracket 170 may be used to hold laptops in place within the front compartment.

Figure 14:
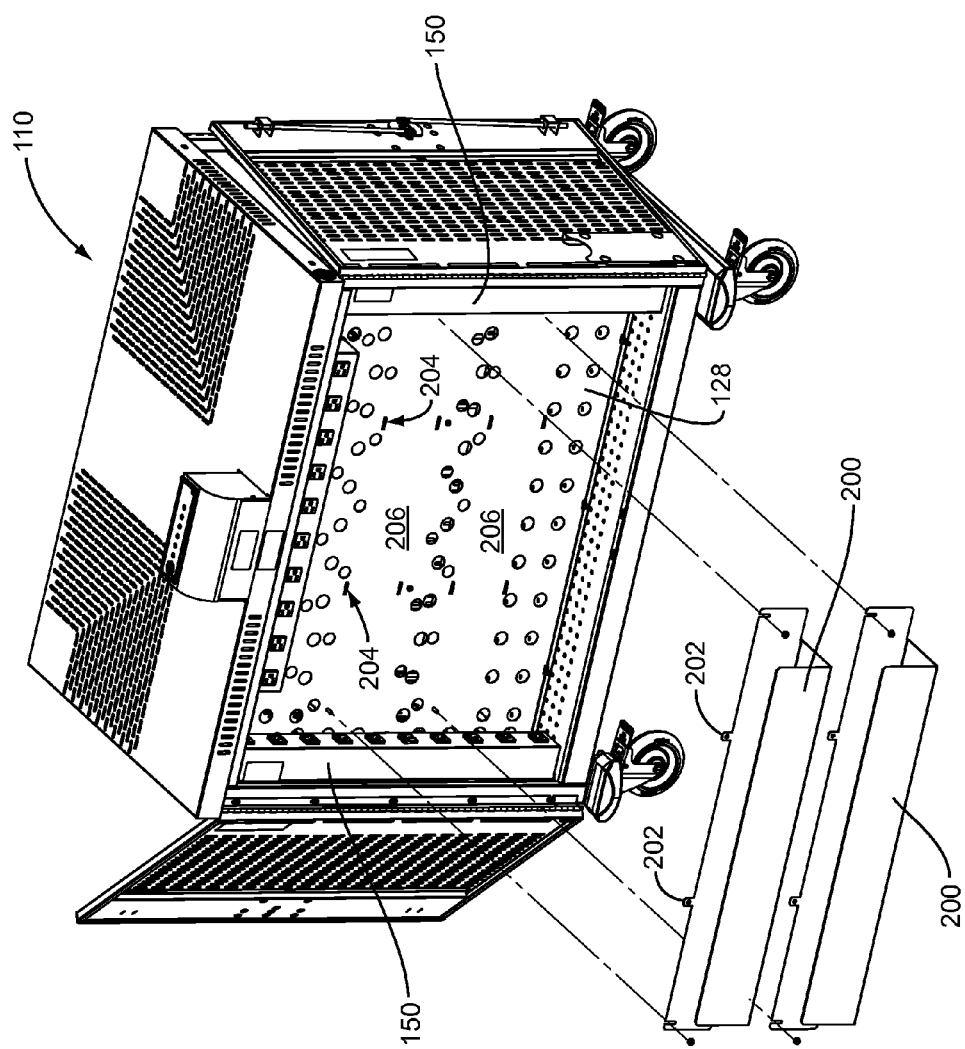
Figure 15:
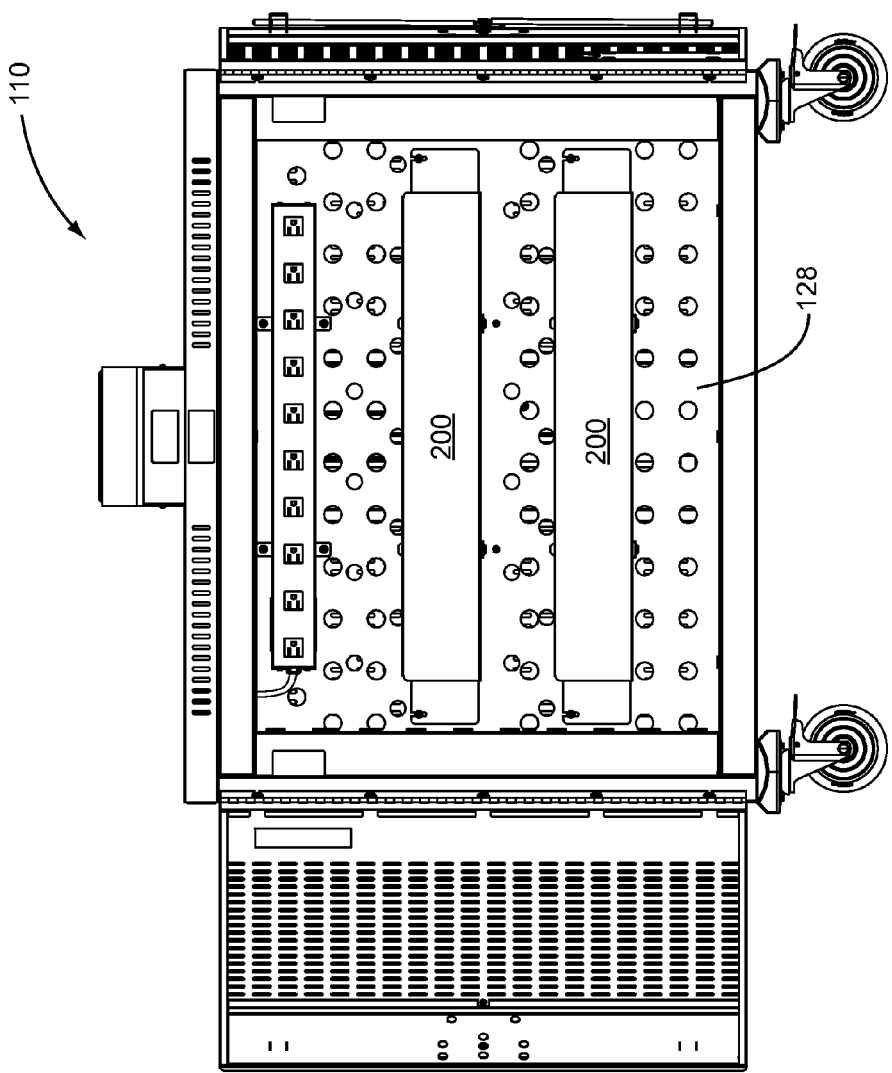

Wire management, and AC adapter storage, is provided in this embodiment through the use of trays 200 (see FIG. 14). Trays 200 have tabs 202 that extend through slots 204 in the dividing panel 128 and are then screwed in place. Additional screws may be used to secure the trays on the dividing panel as well. Note, in this embodiment, that the dividing panel does not have any apertures in a region 206 that will be used to receive tray 202. Rather all the ventilation holes and wire management holes in the dividing panel are disposed either above the trays 202, below the trays 202, or in-between the trays 202. Alternatively, individual vertical shelves may be used to hold the AC adapters for each of the computers to be stored within the computer cart.

Three power strips 150, each having 10 outlets 152, are disposed about the perimeter of the rear compartment of the computer cart. In the illustrated embodiment, one power strip is disposed on the left edge, one on the right edge, and one along the top edge. The power strips are arranged to provide easy access to the power for AC adapters stored within the trays.

In operation, an AC adapter for each laptop computer to be stored within the laptop cart will be plugged into one of the outlets 152 and the excess power cord will be wrapped around the AC adapter. Likewise the low voltage cord will be fed through one of the apertures into the front compartment of the laptop cart via one of the apertures immediately above the tray. The low voltage cords should be spaced out along the tray to go through apertures at locations where the laptops will be stored within the front compartment. For example, if the laptops are stored every 2.5 inches within the front compartment, then the low voltage power cords should likewise be passed through apertures from the rear compartment to the front compartment approximately every 2.5 inches along the divider panel.

The cart has a power module that allows power to be distributed within the cart to charge the laptops stored in the computer cart. An example of how the power module may be formed is shown in FIGS. 1-2. As shown in FIGS. 1-2, in this embodiment, the power module 190 of the computer cart 10 includes two auxiliary outlets 191, an on-off switch 192, a plurality of LEDs 193, 194, and a mode selection button 195. An additional accessory outlet may also be provided inside the rear compartment of the computer cart to enable a peripheral, such as a wireless router, to be plugged into the computer cart. The power switch 192 may be implemented as a light-up toggle switch and enable the computer cart to be turned on/off while plugged into a wall outlet. The mode selection button 195 is used to control which electrical features of the cart are active while the computer cart is turned on.

The power module in the illustrated embodiment has two banks of five Light Emitting Diodes (LEDs) 193, 194 that provide status indications to the operator. In another embodiment, the power module has fewer LEDs such as three LEDs and, accordingly, different numbers of LEDs may be used. In the illustrated embodiment, the power module has a first bank of LEDs 193 on a top surface and a second bank of LEDs on a front surface. Having the LEDs on the top surface enables a person standing by the computer cart to see how the cart is operating. Having the LEDs on the front surface of the power module enables the operator to see how the cart is operating when the operator is further away from the cart, such as if the operator is across the room. This allows a person running the computer cart to monitor the status of the cart and of the computers charging within the cart from a distance.

The computer cart may use different LED color combinations to indicate the status of the computer cart (i.e. which outlets are active) and to indicate the charge status of the computers stored within the art. In one embodiment, the computer cart includes five LEDs in each bank: one yellow LED, three blue LEDs, and one amber LED. When the power switch is turned on, the switch 192 is illuminated indicating that power is now on inside the cart. This also indicates that the hidden accessory and top accessory outlets 191 are on; the accessory outlet will be on whenever the cart is turned on. The other LEDs indicate which of the banks of computers within the cart are charging and the charge status of the computers within the computer cart.

A normal wall outlet generally provides 15 amps of current. Since this is not sufficient to simultaneously charge 30 laptops when the laptops are fully discharged, the power module enables the operator to select how the laptops should be charged. In one embodiment, the operator may elect to charge all laptops in a intelligent round robin manner, in which each bank of computers will be set as the priority channel and be charged for a relatively short, e.g. 3 minute interval, before the next bank of computers is charged for a similar interval as next priority channel (The next priority channel of the last one is the first one). During this process, the priority channel for sure will get the power for the whole duration. If there is still power budget left over, the non-priority channels will also get power. When there is enough power for all the 30 laptops to be charged simultaneously, such as where the laptops are partially charged and thus need less power, the power will get distributed to all of the channels to minimize the total charging time.

The operator may also use the mode button to select to have one selected bank of computers charged continuously for a period of time so that all power is directed to that one bank of computers rather than being shared in a round-robin fashion between all three banks Selection between charging modes may be made via mode selection button 195 or in another manner.

The lights on the power module enable the operator to know which laptops are charging. In one embodiment, if the operator selects the round robin charging mode, the yellow LED will come on to indicate that all laptops are charging. The three blue LEDs will flash as round robin power moves from power strip to power strip. When the system detects that all laptops connected to a particular strip are charged, the system will indicate the charged status via the LEDs. If the computer cart is in the intelligent round robin mode of charging, power will be diverted away from the channel connected to the charged laptops to make the power available to the other channels if necessary.

The power module also has the ability to provide all power to one of the power strips rather than sending power to all computers in a round robin manner. In this "turbo" charging mode, the one of the blue LEDs will be illuminated to indicate which power strip, and hence which bank of computers, is being charged.

Power may also be directed to the auxiliary outlets. Some auxiliary devices, such as printers and projectors, may consume a relatively large amount of power. In one embodiment, the operator may elect to have all power directed to the auxiliary outlets. When the user elects this mode, the amber light is used to indicate that all power in the cart has been diverted to the auxiliary outlets on the power module.

The operator of the cart may control which mode is used to charge the laptops. For example, a mode selection button 195 may be provided on the power module. When the operator presses the button one time, the yellow LED may be illuminated to indicate that the user has entered a mode in which all computers in the cart are to be charged in a round-robin manner. If the user presses the button a second time, turbo mode for one of the three banks of computers (one of the power strips) may be entered. Successively pressing the button an additional time will select a subsequent bank of computers. Depending on the number of banks of computers, the user may have to press the mode selection button two, three, or more times to cycle through each bank of computers. Finally, pressing the button an additional time will enter the operational mode where all of the power is diverted to the auxiliary outlets.

Second generation carts increased the capacity of the charging cart to as many as 30 notebooks or laptops. Charging such a large number of notebooks simultaneously exceeds the current capacity of a single AC circuit. Accordingly, previous carts had time-shared the output of single AC wall outlet by using electromechanical timers to solve the over-current problem. The cart's internal AC power distribution would provided to a power strip for a relatively long period of time, e.g. for 2 hours, to charge the computers connected to that power strip. Then, power would be diverted to another power strip for two hours, and finally diverted to the third power strip for two hours. In this manner, all 30 laptops within a cart could be charged within around 6 hours.

While this type of timing functioned well, it was found that if the laptops were still warm from use when they were plugged into the cart, that some of the computers would be exposed to an additional two hours of thermal stress if they were plugged into an active strip, while other computers would be allowed to cool for two or four hours before charging. This resulted in uneven stress on the set of computers stored in the cart. Likewise, a notebook with a battery deeply discharged may have to wait as long as four hours before a charging cycle would save it from permanent damage. And finally, a short-cycle condition could exist where after three hours in the cart, some laptops would be fully charged, others partially charged and still some experiencing no charging at all.

According to an embodiment, a control circuit is used to greatly decrease heat and electrical stress on the computers rendering faster time to recharge while helping to maintain battery health. By charging the batteries for shorter intervals, each computer is provided with a more equal opportunity to be charged once placed in the cart. This allows more even treatment of the set of laptops to avoid excessive thermal stress to particular laptops and to quickly provide charge to any deeply discharged batteries to avoid storing the batteries in the deeply discharged state for prolonged periods.

In one embodiment, an "Intelligent Round-Robin" charging scheme is used which switches power between outlet strips every three minutes (or other short interval) giving priority to the power strips that require the most amount of power first. Every strip also gets at least a 3 minute "relaxation cycle" once every six minutes to cool down after extended use or between charge cycles. By doing this, the computer cart can avoid any long delay time to start charging batteries in deep discharge—no more than 6 minutes will elapse before a battery begins charging, regardless of which power strip the computer is connected to.

The intelligent round-robin charging scheme also enables short-cycle recharge ability to be implemented for hungry laptops while charge all the laptop at the shortest possible time. Specifically, since each power strip will get at least 3 minutes of charging every 9 minutes, after an hour all units present in the computer cart during that charging period will have at least a useful partial charge. Further, thermal leveling through the 3 minute basic cycle using the Intelligent Round Robin feature ensures that no single bank of laptops are left on for a protracted period without a cool down cycle. This reduces the amount of heat generated by the laptops as a whole, which enables the computer cart to charge a large number of computers while using passive cooling rather than requiring active cooling, e.g. via noisy fans. When all the computer get charged to certain extend thus draw less current and generate less heat, the system switch more channels to be charged all together to short the total charging time dramatically.

In one embodiment, the control 210 receives input from current sensors on each of the channels to determine the amount of current being consumed on that channel. The control receives an analog signal (waveform) representing the amount of current being drawn by the channel and samples the waveform multiple times during a given cycle. For example, the control may sample the current 80 times during a given AC cycle or during a given half AC cycle. The control 210 will integrate the sampled cycle to determine how much current was used during the cycle to thereby determine the amount of current being drawn by the channel. The control will do this independently for each channel.

Knowing how much current is being drawn from each channel enables the control to more intelligently distribute power within the laptop cart. When the laptop cart is loaded with laptops having depleated batteries, each channel is likely to require a considerable amount of power. Hence, the control 210 will cause all available power to be switched to one of the channels. The controller will provide power to that channel for three minutes and then divert all power to another channel. The controller will switch channels each three minutes to provide each of the channels with power for a period of time.

As the laptops start to charge, the laptops will draw less current. Hence, after a while, the control will determine that the channel is not using all of the power within the cart. Hence, it will switch some of the excess power to a second channel. The control will continue to have a primary channel which receives all of the power it is able to consume. The excess power will be provided to a secondary channel. The intelligent round robin process will continue to change the primary channel every three minutes. The secondary channel will likewise be changed each time the primary channel is changed to distribute power within the laptop cart.

As the laptops are further charged, the amount of power consumed by the laptops on a given channel will decrease so that power is able to be provided to all three channels. For example, assume that there are 15 amps available, that the primary channel requires 6 amps and that the secondary channel requires 6 amps. In this instance the control would provide the primary and secondary channels with 6 amps each, and provide the tertiary channel with 3 amps of power. The control would continue to implement the intelligent round robin cycle to cause the identity of the primary channel to vary so that each of the channels would be afforded an opportunity to be the primary channel. As power is made available because it is not required by the primary channel, the power is shifted to the other channels to minimize the overall amount of time required to charge the laptops.

As the laptops become closer to being fully charged, the amount of power consumed by the laptops will continue to decrease until eventually the control is able to provide full power to each of the channels. The control will do this so that all laptops on each of the channels is able to be charged.

When the laptops are charged, therefore, the control 210 causes power to be provided on each of the channels. This allows the laptops to draw operating current from the channels rather than from the batteries while stored in the cart. In normal sleep mode, a laptop may draw a very low amount of power, for example on the order of 0.01 Amps. Thus, leaving the channels ON does not consume significant energy, but allows the batteries to remain fully charged while allowing the laptops to pull their power requirements from the external power supply. Thus, if the laptops are stored in the cart for an extended period of time, they will continue to be fully charged and the batteries will not be required to be used to power the laptops during the extended storage period (assuming the cart is plugged in).

Keeping the channels in the powered state also allows the control to detect if an uncharged laptop is connected to any channel. For example, if the channel is populated with 8 fully charged laptops and an uncharged laptop is then connected to the channel, the current sensor will sense that current is being drawn from the channel. The control can therefore determine when even one uncharged laptop is connected to a given channel and, hence, as laptops are plugged into the cart, the control will automatically sense their state of charge and distribute power within the cart to enable the laptops to be charged regardless of where they are plugged into the cart.

Figure 18:
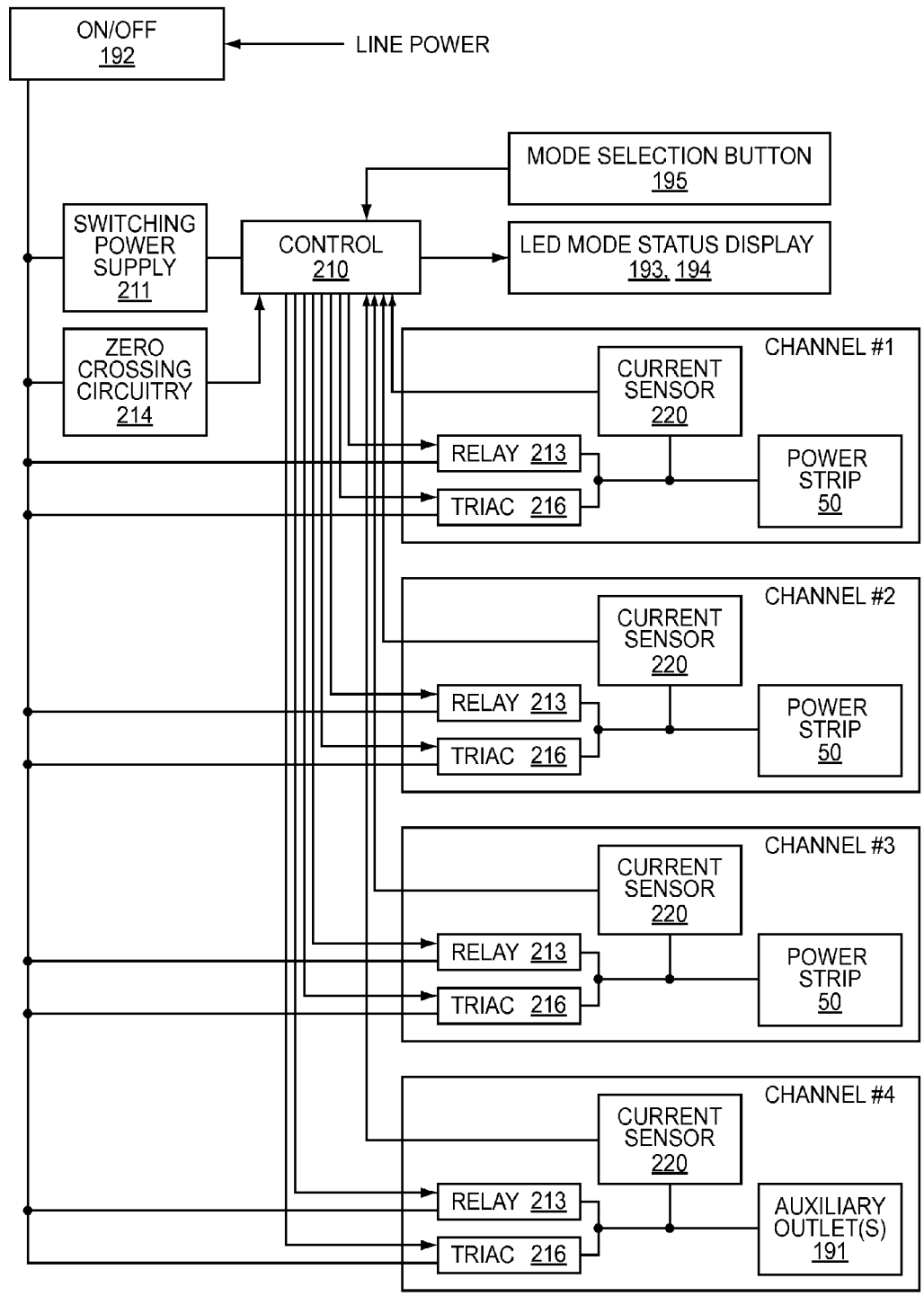
FIGS. 18-21 show an electrical system for use in the computer cart of FIG. 1.

The ability to provide full power to one channel and divert the remaining power to one or more of the other channels is provided, in one embodiment, through the use of relays 213. As shown in FIG. 18, each channel has both a TRIAC 216 and a relay 213. The TRIAC is used while turning the channel on or off, and the relay is used while in steady state to regulate power onto the channel.

When the control is going to turn on a channel, the control will first turn on the TRIAC 216, wait a very short period such as 50 ms and then turn on the relay 213, and then turn off the TRIAC 216. The opposite process is used to turn off the channel. Specifically, if the relay is on, the control 210 will turn on the associated TRIAC 216, turn off the relay 213, and then turn off the TRIAC 216. This allows the TRIAC to be used to absorb the electrical stress and to shield the relay 213.

In one embodiment, Zero-crossing switching is used to enable the AC line current to be switched at a point in the AC cycle where there is the least amount of electrical stress to the switches (TRIACs & relays). This also reduces "nuisance tripping" of the AC circuit breaker.

Figure 19:
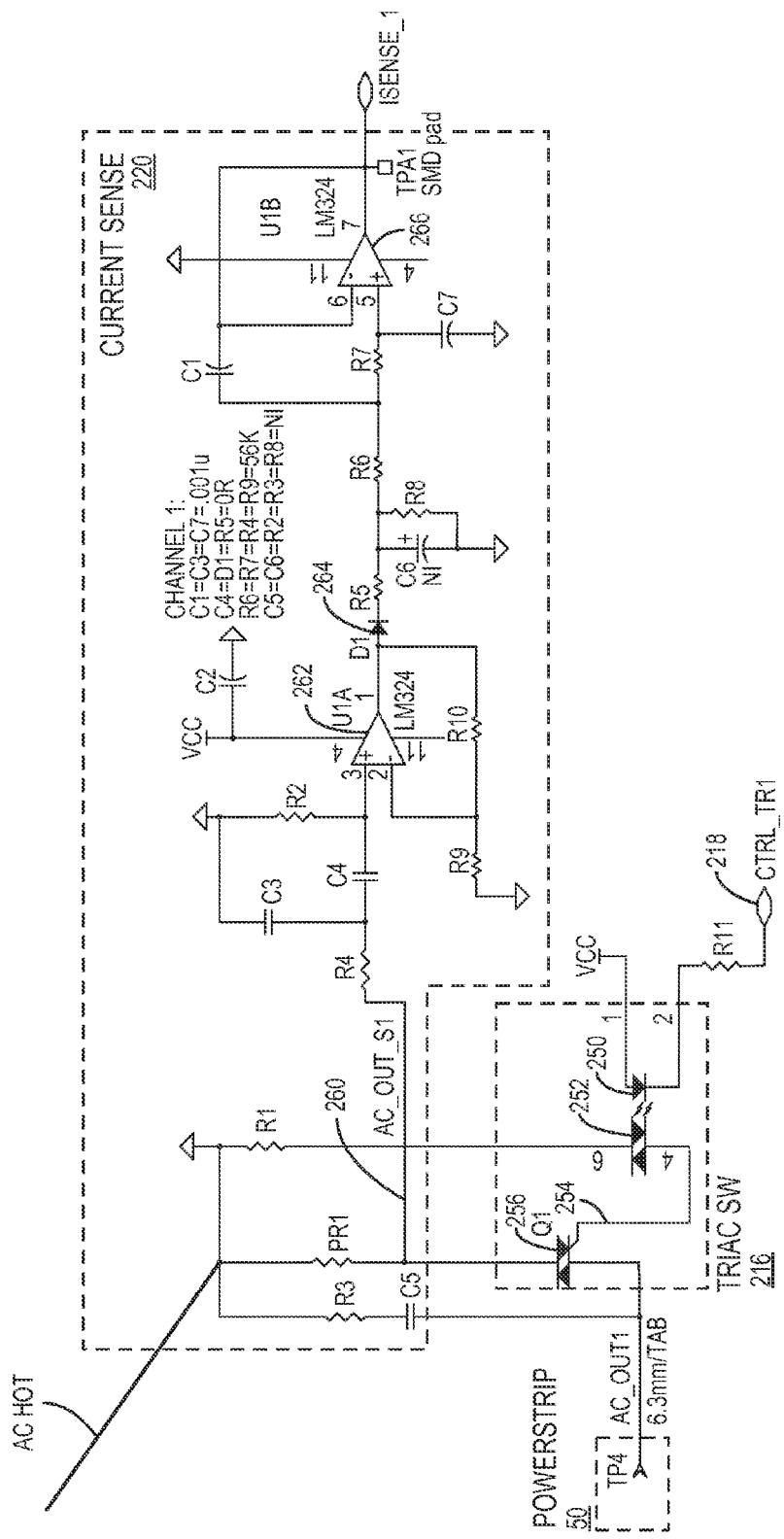
Figure 20:
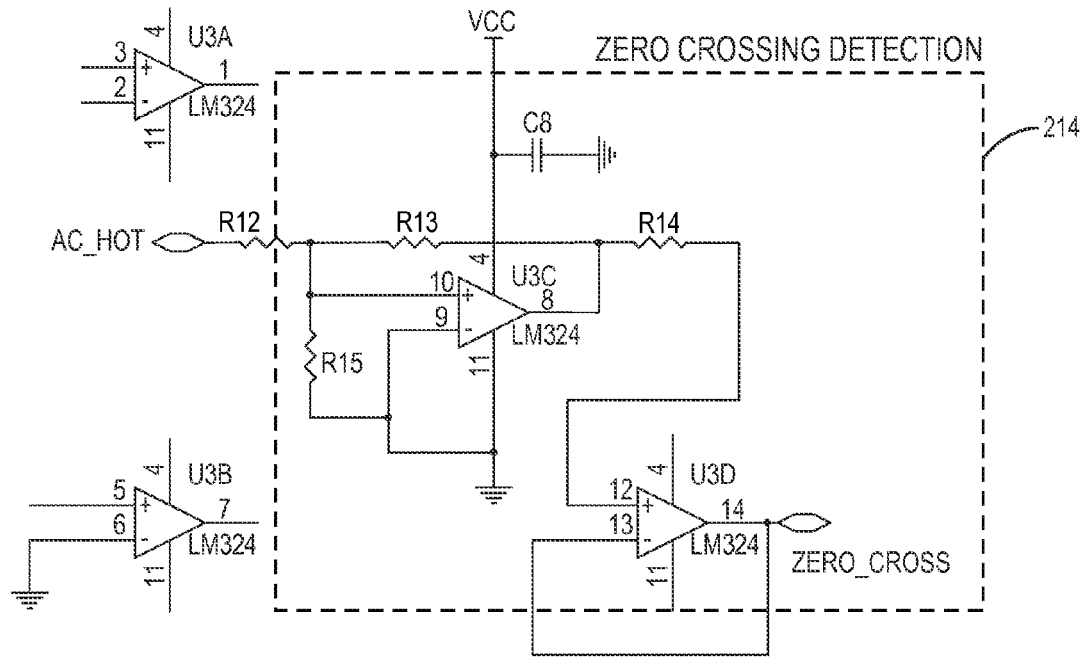
Figure 21:
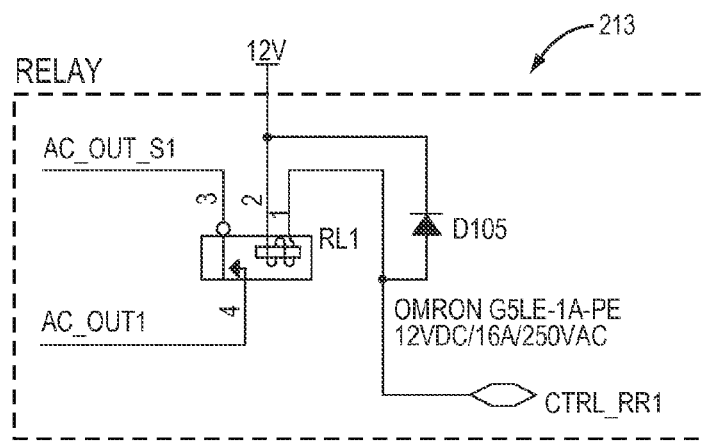

FIGS. 18-21 show an example electrical system 200 that may be used in connection with a computer cart such as the computer cart of FIGS. 1-17. FIG. 18 shows an overview of the electrical system 200 and FIGS. 19-21 show particular aspects of the circuit in greater detail. As shown in FIG. 18, the electrical system has an on/off switch 192 that switches line power (e.g. 220/120 Volt 50/60 Hz power) to the cart. When the user turns the cart on via switch 192, power is provided to each of the channels under the control of control 210. Power is also provided to switching power supply 211 which provides low voltage power to control 210. As noted above, zero crossing circuitry 214 is connected to the line power to provide the control 210 with information as to the location where the voltage on the line is transitioning through zero volts.

The electrical system has a control 210 that receives input from the user via mode selection button 195 and uses the input to selectively activate power to one or more of the channels (channels 1-4). In the illustrated embodiment, channels 1-3 correspond to power strips that will be used to charge laptops stored within the computer cart, and channel 4 is an auxiliary power channel which provides power to auxiliary outlets 191 in power module 190 and to the hidden auxiliary outlet in the rear compartment of the cart. The auxiliary outlet may be always on or may be selectively turned off depending on the mode selected by the user.

When the cart is plugged in and the computer cart is turned on via on/off switch 192, 120/240 volt AC power 212 will selectively be applied to one or more of the channels under the control of control 210. The control 210 uses zero crossing circuitry 214 to detect when the voltage is approximately at zero volts to time activation/deactivation of the circuits to correspond with a neutral voltage condition on line power 212. TRIAC switches 216 and relays 213 are used to selectively turn channels 1-3 on and off upon application of control signals from control 210 on lines 218. Each TRIAC/relay combination collectively forms a switch to turn on/off a particular channel within the laptop cart.

A current sensor 220 is used to sense an amount of current used by a particular channel. The current sensor 220 enables the control to determine how much current is being used by a channel so that all the available power is utilized within the laptop cart. In one embodiment, the control 210 performs analog to digital conversion to convert the analog output from the current sensor into a digital signal. For example, the controller may sample the signal output from the current sensor at a particular frequency (e.g. 80 times per cycle) and integrate the current signal from the current sensor 220. This allows the control to know the amount of current being drawn by the channel. Software within the control 210 then enables the intelligent round robin distribution of power within the laptop cart as described above.

In one embodiment, the auxiliary channel is always powered to enable the outlets associated with the auxiliary channel to be available for use regardless of the charging state of the other channels within the computer cart. However, the auxiliary outlets may not always require power, since it may be that nothing is plugged into any of the auxiliary outlets. Hence, in one embodiment, available power not used on the auxiliary circuit is diverted to the other channels to allow all of the power within the cart to be intelligently utilized. In this embodiment, the current sensor #4 associated with the auxiliary channel #4 is used to detect how much power is being drawn by devices connected to the auxiliary outlets 191. The balance of the power not used by the devices connected to the auxiliary outlets is made available to the other channels to thereby increase the amount of power that may be used to charge the laptops stored within the cart.

In the previous description, an embodiment was described in which the control 210 causes the channel selection to change every three minutes. The invention is not limited to this particular interval, as other suitably short time interval may be selected instead.

In this embodiment, the control 210 determines a priority of the channels based on the amount of current used by the channel (as reported by the current sensors). For example, the control may determine that channel #2 requires the most power, channel #1 requires the second most, and that channel #3 requires the least. Initially, the control 210 may then prioritize the channels #2, #1, #3 and select either one or two of the channels to charge, depending on the amount of power available. The primary channel #2 may be fully powered, for example, and the secondary channel #1 may be partially powered. Alternatively, the same amount of power may be provided to both channels #2 and #1. After expiration of a charging interval, the control will switch to charge a different set of channels. For example, the control may turn channel #2 off and charge channels #1 and #3. After expiration of a further interval, the control will switch to select yet another combination, such as channels #3 and #2. This process will repeat as necessary until the laptops are charged. As the laptops are charged, the laptops will draw less current. Hence, at some point during the charging process, the control will determine that it has sufficient power to simultaneously activate all laptop charging channels (#1, #2, and #3). Accordingly, at that point the control will stop using the round robin process and simply activate all of the channels.

FIG. 19 shows an example channel including power strip 50, TRIAC switch 216, and current sensor 220. As shown in FIG. 19, TRIAC switch 216 receives a control signal from control 210 which activates diode 250. Diode 250 activates low voltage TRIAC 252 to enable gate signal on line 254. Voltage at TRIAC 252 is set by resistor R1. Upon application of gate signal on line 254, TRIAC 256 will cause line power to be applied to power strip 50. Snubber circuit formed from series connected resistor R3 and capacitor C5 is provided in this embodiment to assist in turning off TRIAC 256.

Current sensor circuit 220 receives an indication of the amount of current being drawn by powerstrip 50 on line 260. The signal on line 260 is a relatively low voltage. It is passed to amplifier 262 which has a gain equal to R10/R9. The amplified voltage is passed through a filter circuit U1B to output current signal ISENSE. The current sense signal is provided to control 210 where it is integrated to determine the total amount of current drawn by the channel.

FIG. 20 shows an example zero crossing detection circuit. Other zero crossing detection circuits may be used as well. Use of zero cross detection circuitry enables TRIAC 216 to be turned on when the line voltage is close to zero volts, to prevent switching the outlets on/off at higher voltages.

FIG. 21 shows an example relay switch that may be used in the power system shown in FIG. 18. As noted above, the relay switch 213 operates in parallel with TRIAC switch 216 to regulate the amount of power provided to a given channel. The TRIAC protects the relay from transient voltages while the relay is being turned on/off, and the relay regulates the amount of power provided to the channel while active. The use of relay switches enables the operator to select, for example, to charge only one of the channels manually for a period of time. The control 210 provides control signals to both relays 213 and TRIAC switches 216 to provide the user with control over how the laptops within the cart are charged.

The functions described herein attributed to the control 210 may be implemented as a set of program instructions that are stored in a computer readable memory and executed on one or more processors. The functions attributed to control 210 may also be implemented using discrete components, integrated circuitry such as an Application Specific Integrated Circuit (ASIC), programmable logic used in conjunction with a programmable logic device such as a Field Programmable Gate Array (FPGA) or microprocessor, a state machine, or any other device including any combination thereof. Programmable logic can be fixed temporarily or permanently in a tangible medium such as a read-only memory chip, a computer memory, a disk, or other storage medium. All such embodiments are intended to fall within the scope of the present invention.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A computer cart, comprising:
   a front compartment accessible by a first set of doors configured to store a plurality of laptop computers;
   a rear compartment accessible by a second set of doors configured to store a plurality of AC adapters and associated wiring for the plurality of laptop computers; and
   a continuous dividing panel extending from adjacent a bottom interior surface of the computer cart up to a top interior of the computer cart, as an integral structure, and separating the front compartment and rear compartment, the continuous dividing panel enabling the rear compartment to be independently secured by preventing access to items stored in the rear compartment from the front compartment; and
   a plurality of horizontal shelves vertically spaced within the front compartment;
   wherein each of the plurality of shelves has at least one extension designed to pass through a corresponding slot in the dividing panel, each extension being provided with a pair of indentations on side edges to provide cord management for AC adapters in the rear compartment.

2. The computer cart of claim 1, wherein each shelf has a plurality of the extensions designed to pass through corresponding slots in the dividing panel.

3. The computer cart of claim 2, wherein each of the plurality of extensions of a given shelf extends through corresponding individual slots into the rear compartment to form AC adapter shelves within the rear compartment.

4. The computer cart of claim 3, wherein each of the AC adapter shelves is sized to hold an individual AC adapter in the rear compartment for a corresponding laptop computer to be stored within the front compartment of the computer cart.

5. The computer cart of claim 3, wherein each of the AC adapter shelves has a pair of edges extending from the dividing panel toward a rear of the computer cart, and wherein one of the pair of indentations is formed on each of the pair of edges.

6. The computer cart of claim 1, wherein the dividing panel has a plurality of apertures formed therein to enable low voltage wires from the AC adapters to be passed from the rear compartment into the front compartment.

7. The computer cart of claim 6, wherein the apertures further provide air circulation between the front compartment and rear compartment.

8. The computer cart of claim 6, further comprising soft protectors within the apertures which are used to enable the low voltage wires from the AC adapters to be passed from the rear compartment to the front compartment to protect the low voltage wires from chafing within the apertures.

9. The computer cart of claim 8, wherein the soft protectors further resist the low voltages wires from being pulled into the front compartment.

10. The computer cart of claim 1, wherein one of the shelves within the front compartment is configured to hold a plurality of laptops, and wherein the computer cart is designed to hold the laptops in a vertical orientation.

11. The computer cart of claim 10, further comprising a dividing structure disposed on the shelf to hold the laptop computers in the vertical orientation on the shelf.

12. The computer cart of claim 11, wherein the dividing structure is configured to be spaced at intervals to define vertical compartments for the laptops.

13. The computer cart of claim 12, wherein the dividing panel has a plurality of apertures formed therein to enable low voltage wires from the AC adapters to be passed from the rear compartment into the front compartment, so that each of the low voltage wires from each of the AC adapters will be spaced to coincide with a respective one of the defined vertical compartments.

14. The computer cart of claim 10, wherein the rear compartment further comprises a plurality of storage bins attached to the dividing panel to hold AC adapters for the laptop computers.

* * * * *